(12) United States Patent
Morimoto et al.

(10) Patent No.: US 8,462,287 B2
(45) Date of Patent: Jun. 11, 2013

(54) ACTIVE MATRIX SUBSTRATE AND DISPLAY DEVICE USING THE SAME

(75) Inventors: Takashi Morimoto, Osaka (JP); Mitsuaki Hirata, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 230 days.

(21) Appl. No.: 13/058,497

(22) PCT Filed: Aug. 19, 2009

(86) PCT No.: PCT/JP2009/064498
§ 371 (c)(1),
(2), (4) Date: Feb. 10, 2011

(87) PCT Pub. No.: WO2010/024161
PCT Pub. Date: Mar. 4, 2010

(65) Prior Publication Data
US 2011/0157490 A1    Jun. 30, 2011

(30) Foreign Application Priority Data

Aug. 28, 2008 (JP) .................................. 2008-219589

(51) Int. Cl.
*G02F 1/1365* (2006.01)
(52) U.S. Cl.
USPC .................. 349/50; 349/49; 349/41; 349/42; 349/43

(58) Field of Classification Search
None
See application file for complete search history.

(56) References Cited

U.S. PATENT DOCUMENTS 6,034,747 A * 3/2000 Tanaka et al. .................. 349/43
7,145,623 B2 * 12/2006 Sasaki ........................... 349/144

FOREIGN PATENT DOCUMENTS

JP   9-152628 A    6/1997
JP   2000-352941 A   12/2000

\* cited by examiner

*Primary Examiner* — Thanh-Nhan P Nguyen
(74) *Attorney, Agent, or Firm* — Birch, Stewart, Kolasch & Birch, LLP

(57) ABSTRACT

An active matrix substrate capable of suppressing a change in an off characteristic of the TFT even when current passage time becomes longer is provided. A diode is connected between a video signal line and a conductive plate formed so as to cover a TFT of a pixel formation portion. Current is passed to the diode when a potential of a video signal applied to the video signal line is lower than that of the conductive plate, and the potential of the conductive plate becomes equal to that of the video signal line. No current flows when the potential of the video signal is higher than that of the conductive plate and the potential of the diode remains the same. Consequently, a leak current which flows from the pixel electrode of the pixel formation portion to the video signal line when the TFT is in the off state is suppressed.

7 Claims, 21 Drawing Sheets

Fig. 19
(A)
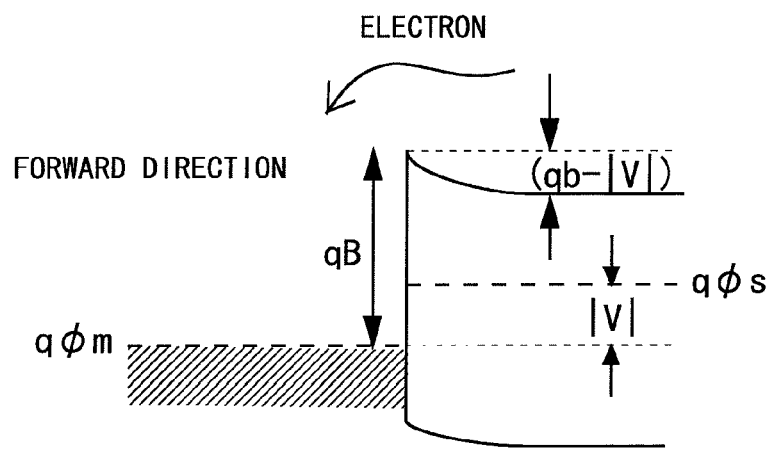
(B)
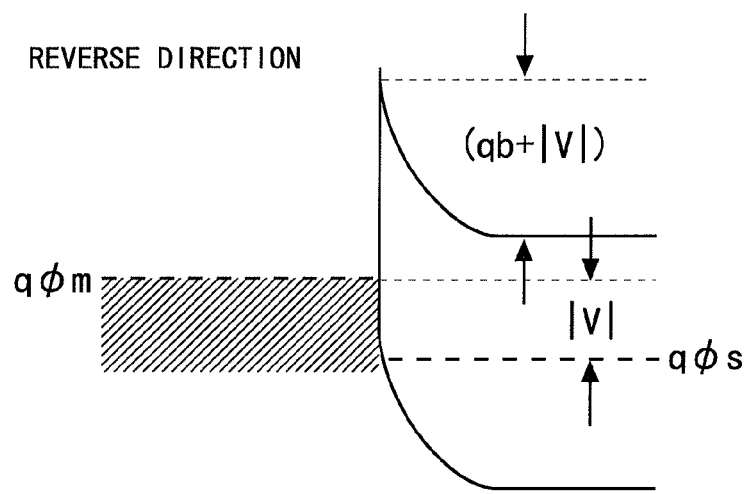

ACTIVE MATRIX SUBSTRATE AND DISPLAY DEVICE USING THE SAME

This application is the U.S. national stage application of International Patent Application No. PCT/JP2009/064498, filed Aug. 19, 2009, which claims priority to Japan Application No. 2008-219589, filed Aug. 28, 2008, the disclosures of each of which are incorporated herein by reference in their entirety.

TECHNICAL FIELD

The present invention relates to an active matrix substrate and a display device using the same and, more particularly, to an active matrix substrate in which a change in an off characteristic of a thin film transistor caused by increase in current passage time is suppressed and to a display device using the same.

BACKGROUND ART

As a display of a television, a personal computer, or the like, an active matrix-type liquid crystal display device capable of displaying a high-quality video image is used. A thin film transistor (hereinafter, called a "TFT") is provided in each of pixel formation portions in a liquid crystal panel mounted on the liquid crystal display device. In the liquid crystal display device, when the TFT is in an on state, the potential of a video signal to be displayed is applied from a video signal line to a pixel electrode. Until the potential of a video signal to be displayed next is applied, the TFT is in an off state, and the potential of the video signal to be displayed is held in the pixel formation portion.

However, when the current passage time in the liquid crystal display device becomes long, the off characteristic of the TFT changes. As a result, in a liquid crystal panel of the normally black type (type in which the panel is seen black when no voltage is applied) having, for example, an n-channel type TFT, when a gate voltage is increased from a gate off voltage to a predetermined voltage which is lower than a threshold voltage in a state where the potential of the video signal is held in the pixel formation portion, although the TFT should still be in the off state, the brightness of the video image displayed in white decreases. In this state, when the TFT is turned on again and the potential of the video signal to be displayed next is applied to the pixel electrode, the video image becomes white again. At this time, the video image displayed in the liquid crystal panel looks gray to a viewer. The gate off voltage at which a video image to be essentially white is seen gray as described above is called a "blurring voltage".

The blurring voltage decreases to a predetermined value as the current passage time of the liquid crystal display device increases. In consideration of the fact, the gate off voltage has to be set to a lower value. However, to enable the gate off voltage to be set to a lower value, the breakdown voltage of a scanning signal line drive circuit has to be set high, which causes a problem in that the manufacturing cost of the scanning signal line drive circuit becomes high.

The reason why the blurring voltage decreases as the current passage time of the liquid crystal display device increases is considered as follows. Specifically, when the current passage time of the liquid crystal display device increases, on the surface of a semiconductor layer serving as a channel region of the TFT, charges are accumulated in an interlayer insulating film near the surface of the side opposite to the side on which the gate electrode is disposed (hereinafter, called a "back gate side"). By charges accumulated in the interlayer insulating film, an inversion layer is formed on the surface of the semiconductor layer on the back gate side. As a result, since the gate-off voltage is applied, the off characteristic of the TFT which should essentially be in the off state changes, and the blurring voltage decreases. With the blurring voltage decrease, even if the gate-off voltage is applied to the TFT, a leak current flows from the drain electrode to the source electrode of the TFT. Consequently, the potential of the video signal held in the pixel formation portion decreases, and the brightness of the video image is reduced.

As the liquid crystal display device is spread in various fields such as in televisions, improvement in the display quality of the liquid crystal display device is required. Therefore, to increase the display quality, it is required to suppress decrease in the blurring voltage due to the change in the off characteristic of the TFT caused by increase in the current passage time.

Consequently, in Patent Document 1, a conductive plate connected to a pixel electrode or a conductive plate electrically isolated is conventionally disposed so as to face a channel region in a TFT via an interlayer insulating film.

In this case, charges are not easily accumulated on the surface of the interlayer insulating film and an alignment film, so that a change in the off characteristic of the TFT can be suppressed.

Prior Art Document
Patent Document

[Patent document 1] Japanese Unexamined Patent Publication No. 9-152628

DISCLOSURE OF THE INVENTION

Problem to be Solved by the Invention

However, in Patent Document 1, in the case where the conductive plate is connected to the pixel electrode, when the potential of a video signal applied to a video signal line changes, the potential of the conductive plate also changes accordingly. In the case where the conductive plate is electrically isolated, the potential of the conductive plate also changes by being influenced by the potentials of a source electrode, a drain electrode, a common electrode, and the like. In accordance with the change of the potential of the conductive plate changes, charges are accumulated in the interlayer insulating film near the surface of the semiconductor layer on the back gate side. When the charges are accumulated in such a manner, the off characteristic of the TFT changes, and the blurring voltage falls. Consequently, a problem occurs in that a liquid crystal display device cannot display a higher-quality video image.

Therefore, an object of the present invention is to provide an active matrix substrate in which a change in the off characteristic of a TFT is suppressed even when current passage time becomes long and a display device using the same in order to increase display quality of a video image.

Means for Solving the Problems

According to a first aspect of the present invention, there is provided an active matrix substrate comprising:
a plurality of video signal lines for transmitting a plurality of video signals;
a plurality of scanning signal lines intersecting the plurality of video signal lines; and
a plurality of pixel formation portions disposed in a matrix form at respective intersections of the plurality of video signal lines and the plurality of scanning signal lines,
each of the pixel formation portions includes:

a thin film transistor having a source electrode connected to a video signal line passing through the corresponding intersection and entering a conductive state when a scanning signal line passing through the corresponding intersection is activated;

a pixel electrode connected to a drain electrode of the thin film transistor;

a conductive plate formed in a position on a side opposite to a side on which the scanning signal line of an intrinsic semiconductor layer serving as a channel region of the thin film transistor is formed, so as to cover at least the channel region; and a diode in which an anode and a first cathode are joined, and the anode is connected to the conductive plate, and the first cathode is connected to anyone of the video signal line, the pixel electrode, and the scanning signal line.

According to a second aspect of the present invention, in the first aspect of the present invention, the diode is a pn junction diode.

According to a third aspect of the present invention, in the second aspect of the present invention, the anode of the diode contains an impurity of a first conductivity type, the first cathode contains an impurity of a second conductivity type, and the diode further includes a second cathode containing an impurity of the second conductivity type having concentration lower than that of the first cathode, between the anode and the first cathode.

According to a fourth aspect of the present invention, in the first aspect of the present invention, the diode is a Schottky barrier diode.

According to a fifth aspect of the present invention, in the fourth aspect of the present invention, the first cathode of the diode includes an intrinsic semiconductor layer, the anode of the diode includes a metal wiring layer having a work function larger than that of the intrinsic semiconductor layer, and the Schottky barrier diode is formed by making the metal wiring layer and the intrinsic semiconductor layer in contact with each other.

According to a sixth aspect of the present invention, in the fourth aspect of the present invention, the scanning signal line includes a first scanning signal line for activating the thin film transistor and a second scanning signal line electrically insulated from the first scanning signal line, and the Schottky barrier diode is formed above the second scanning signal line.

According to a seventh aspect of the present invention, there is provided an active matrix display comprising the first aspect of the active matrix substrate.

Effect of the Invention

According to the first aspect of the present invention, on the intrinsic semiconductor layer serving as the channel region of the thin film transistor, the conductive plate is formed on the side opposite to the side on which the scanning signal line is formed, so as to cover at least the channel region. When the anode of the diode is connected to the conductive plate and the first cathode is connected to any one of the video signal line, the pixel electrode, and the scanning signal line in which the potential fluctuates, a forward voltage or an reverse voltage is applied to the diode depending on the magnitude relation between the potential of the conductive plate and the potential of the video signal line or the like and the potential of the conductive plate becomes to the lowest potential among potentials of the video signal line and the like to which the first cathode is connected. At this time, even when the current passage time of the display device is increased, occurrence of the inversion layer on the surface on the conductive plate side of the intrinsic semiconductor layer is suppressed, so that no leak current flows when the thin film transistor is in the off state. Consequently, fluctuations in the off characteristic of the thin film transistor can be suppressed.

According to the second aspect of the present invention, since the pn junction diode is used as the diode, the same effect as that of the first aspect is obtained.

According to the third aspect of the present invention, by providing a second cathode containing an impurity of the second conductivity type having concentration lower than that of the first cathode, between the anode and the first cathode forming the pn junction diode, also in the case where a high voltage in an reverse direction is applied across the anode and the first cathode, the electric field intensity in the pn junction is lessened. Consequently, the breakdown voltage in the reverse direction of the pn junction diode can be made higher.

According to the fourth aspect of the present invention, since the switching operation of the Schottky barrier diode is fast, the potential of the conductive plate is promptly clamped to the lowest potential among potentials applied to the scanning signal line. Consequently, as compared with the case of using the pn junction diode, a change in the off characteristic of the thin film transistor can be further suppressed.

According to the fifth aspect of the present invention, the Schottky barrier diode is formed by making the intrinsic semiconductor layer and the metal wiring layer having a work function larger than that of the intrinsic semiconductor layer in contact with each other. Since the first cathode of the Schottky barrier diode is formed by the intrinsic semiconductor layer of low impurity concentration, also when a high voltage in the reverse direction is applied to the junction, the electric field intensity of the junction is lessened. Consequently, the breakdown voltage in the reverse direction of the Schottky barrier diode can be made higher.

According to the sixth aspect of the present invention, by forming the Schottky barrier diode above the second scanning signal line electrically insulated from the first scanning signal line, the characteristic of the Shottky barrier diode can be prevented from being fluctuated by a scanning signal supplied to the first scanning signal line.

According to the seventh aspect of the present invention, since the active matrix substrate according to the first aspect of the present invention is used for the display device, the display device can display a high-quality video image.

BRIEF DESCRIPTION OF THE DRAWINGS

FIG. 19(A) is a band diagram when a voltage in a forward direction is applied to a Schottky barrier, and FIG. 19(B) is a band diagram when a voltage in an reverse direction is applied to the Schottky barrier.

MODE FOR CARRYING OUT THE INVENTION

<1. First Embodiment>
<1.1 Configuration of Liquid Crystal Display Device>

Figure 1:
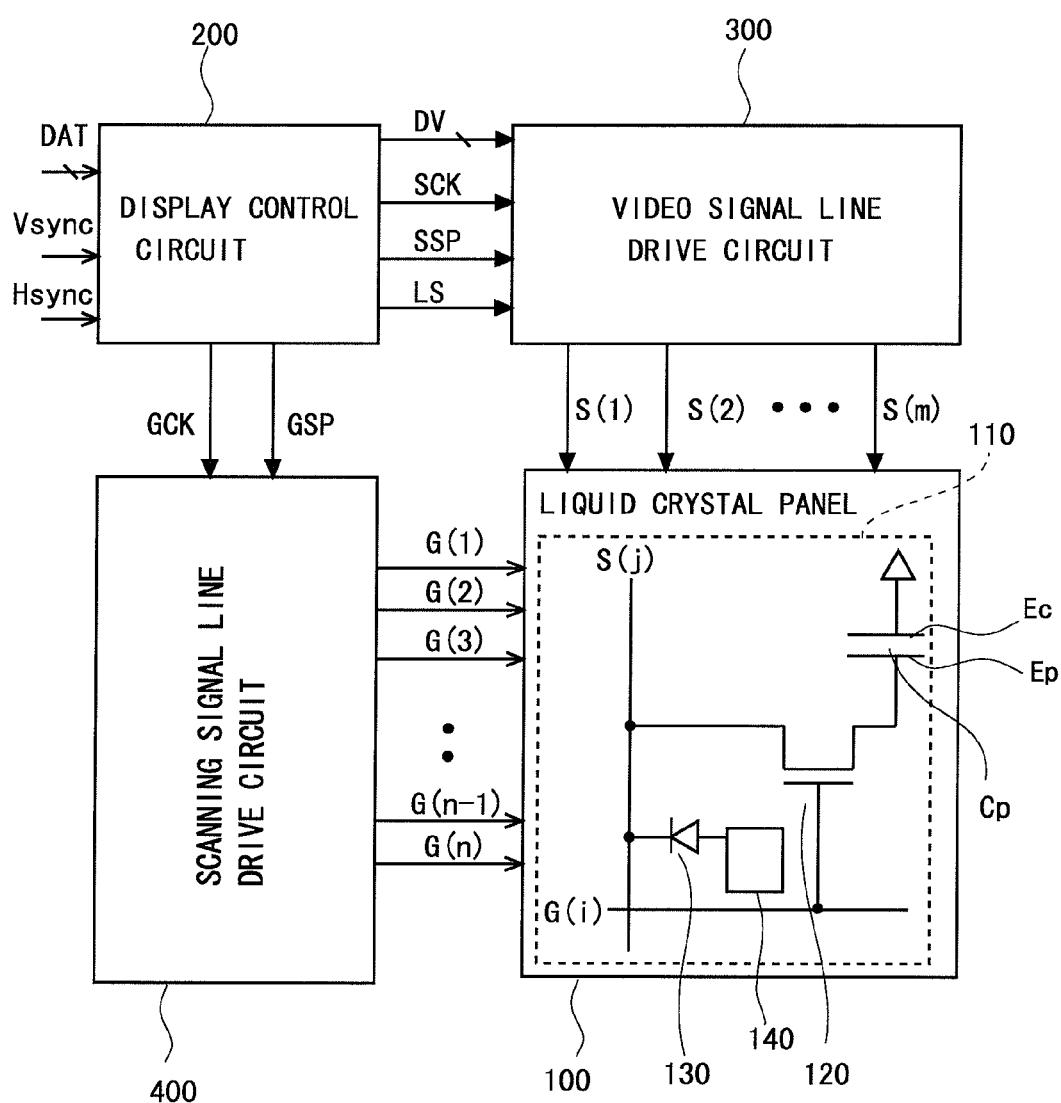
FIG. 1 is a block diagram showing a configuration of an active matrix-type liquid crystal display device according to a first embodiment of the present invention.

FIG. 1 is a block diagram showing a configuration of an active matrix-type liquid crystal display device according to a first embodiment of the present invention. The active matrix-type liquid crystal display device shown in FIG. 1 has a liquid crystal panel 100, a display control circuit 200, a video signal line drive circuit 300, and a scanning signal line drive circuit 400.

In the liquid crystal panel 100, m video signal lines S(1) to S(m) (m is an integer greater than or equal to 1) and n scanning signal lines G(1) to G(n) (n is an integer greater than or equal to 1) are formed so as to orthogonally cross each other. The video signal lines S(1) to S(m) are driven by the video signal line drive circuit 300, and the scanning signal lines G(1) to G(n) are driven by the scanning signal line drive circuit 400.

Further, in the liquid crystal panel 100, (m×n) pixel formation portions 110 are formed at respective intersections of the video signal lines S(1) to S(m) and the scanning signal lines G(1) to G(n). Each pixel formation portion 110 includes an n-channel type TFT 120 using, as a gate electrode, a scanning signal line passing through a corresponding intersection and having a source electrode connected to a video signal line passing through the intersection, a pixel electrode Ep connected to a drain electrode of the TFT 120, a common electrode Ec provided commonly to the (m×n) pixel formation portions 110, a liquid crystal layer (not shown) sandwiched between the pixel electrode Ep and the common electrode Ec, a conductive member (hereinafter, called a "conductive plate") 140 made of a conductive material and disposed so as to cover the TFT 120, and a diode 130 having a cathode connected to the video signal line and an anode connected to the conductive plate 140. By the pixel electrode Ep, the common electrode Ec, and the liquid crystal layer sandwiched by the electrodes, a pixel capacitance Cp is constructed.

The display control circuit 200 receives a data signal DAT, a vertical synchronizing signal Vsync, and a horizontal synchronizing signal Hsync sent from the outside, and outputs a digital video signal DV, as well as a source start pulse signal SSP, a source clock signal SCK, and a latch strobe signal LS for controlling a timing of displaying a video image on the liquid crystal panel 100, to the video signal line drive circuit 300. The display control circuit 200 outputs a gate start pulse signal GSP and a gate clock signal GCK to the scanning signal line drive circuit 400.

The video signal line drive circuit 300 receives the digital video signal DV, the source start pulse signal SSP, the source clock signal SCK, and the latch strobe LS outputted from the display control circuit 200, and gives the potential of a video signal for driving (hereinafter, called a "video signal") as an analog signal to each of the video signal lines S(1) to S(m). The scanning signal line drive circuit 400 receives the gate start pulse signal GSP and the gate clock signal GCK outputted from the display control circuit 200, sequentially activates each of the scanning signal lines G(1) to G(n), and turns on the TFT 120 connected to the activated scanning signal line.

As described above, in the liquid crystal display device, the potential of a video signal according to a video image to be displayed is supplied from the video signal line drive circuit 300 to each of the video signal lines S(1) to S(m), and the scanning signal lines G(1) to G(n) are sequentially activated by the scanning signal line drive circuit 400. As a result, the potential of the video signal according to the video image to be displayed is supplied to the pixel electrode Ep via the TFT 120 connected to the activated scanning signal line, and the potential of the video signal is applied to the liquid crystal layer between the pixel electrode Ep and the common electrode Ec. By the voltage applied to the liquid crystal layer, the amount of light transmission through the liquid crystal layer is controlled, whereby a video image is displayed on the liquid crystal panel 100.

<1.2 Configuration of Pixel Formation Portion>

Figure 2:
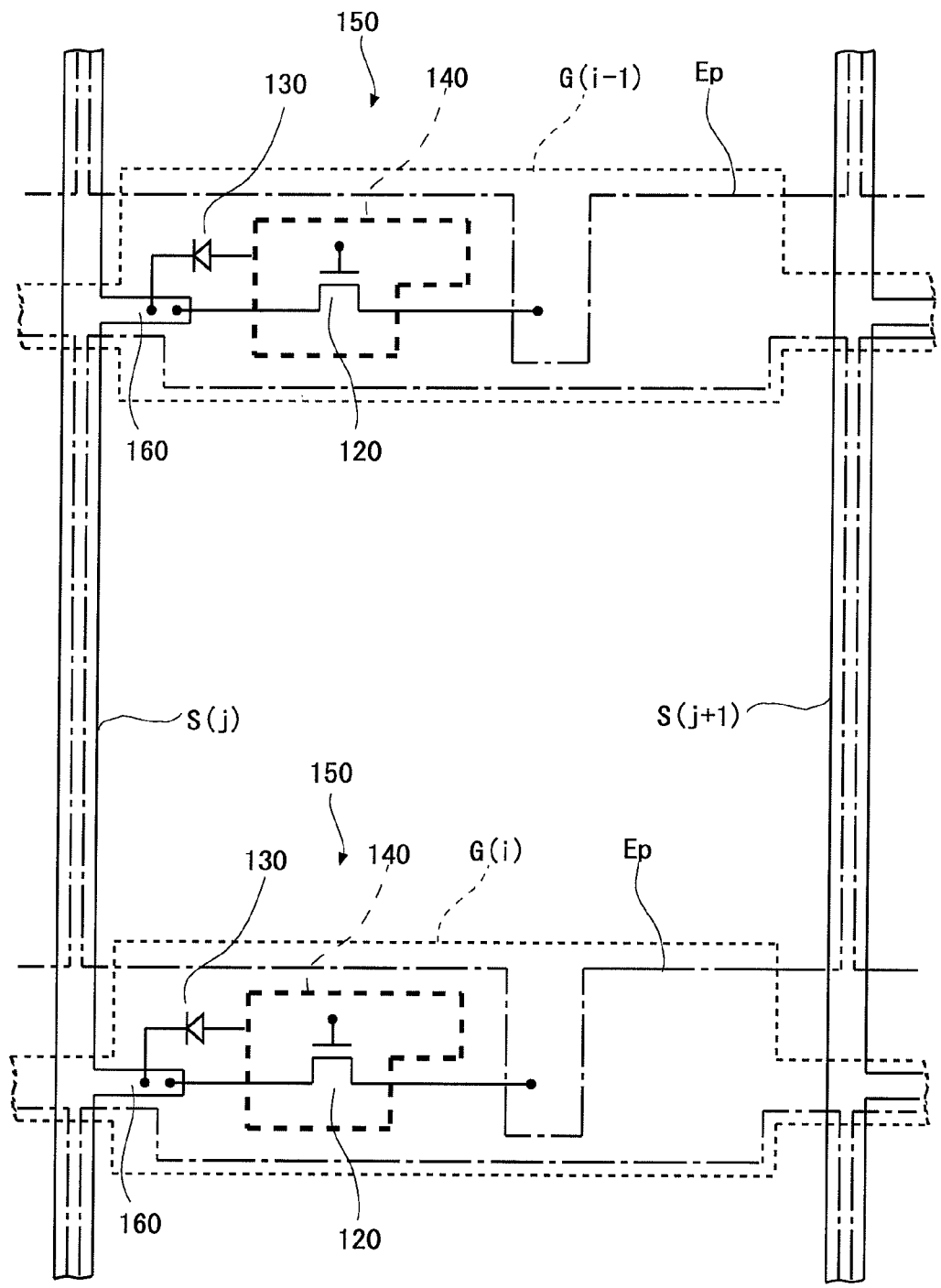
FIG. 2 is an enlarged plan view showing the configuration of a pixel formation portion in the liquid crystal display device of FIG. 1.

FIG. 2 is an enlarged plan view of the pixel formation portion 110 formed in the liquid crystal panel 100. As shown in FIG. 2, in the liquid crystal panel 100, j-th (j is an integer between 1 and m inclusive) and (j+1) th video signal lines S(j) and S(j+1) are formed in parallel, and (i-1) th (i is an integer between 1 and n inclusive) and i-th scanning signal lines G(i-1) and G(i) are formed in parallel in a direction orthogonal to the video signal lines S(j) and S(j+1). The pixel electrode Ep is formed so that its peripheral part overlaps a part of the video signal lines S(j) and S(j+1) and the scanning signal lines G(i-1) and G(i). In the pixel formation portion 110, TFT control circuits 150 each including the TFT 120, the diode 130, and the conductive plate 140 are formed on the scanning signal lines G(i-1) and G(i) near the intersections of the video signal line S(j) and the scanning signal lines G(i-1) and G(i).

The source electrode of the TFT 120 is connected to a source input unit 160 branched from the video signal line S(j), and the drain electrode is connected to the pixel electrode Ep. Each of the scanning signal lines G(i-1) and G(i) formed below the TFT 120 via an insulating film also functions as the gate electrode of the TFT 120. In a position opposed to the TFT 120 via the interlayer insulating film, the conductive member 140 is formed so as to cover the TFT 120. The cathode of the diode 130 is connected to the source input unit 160 and the anode is connected to the conductive plate 140.

<1.3 Equivalent Circuit of TFT Control Circuit>

Figure 3:
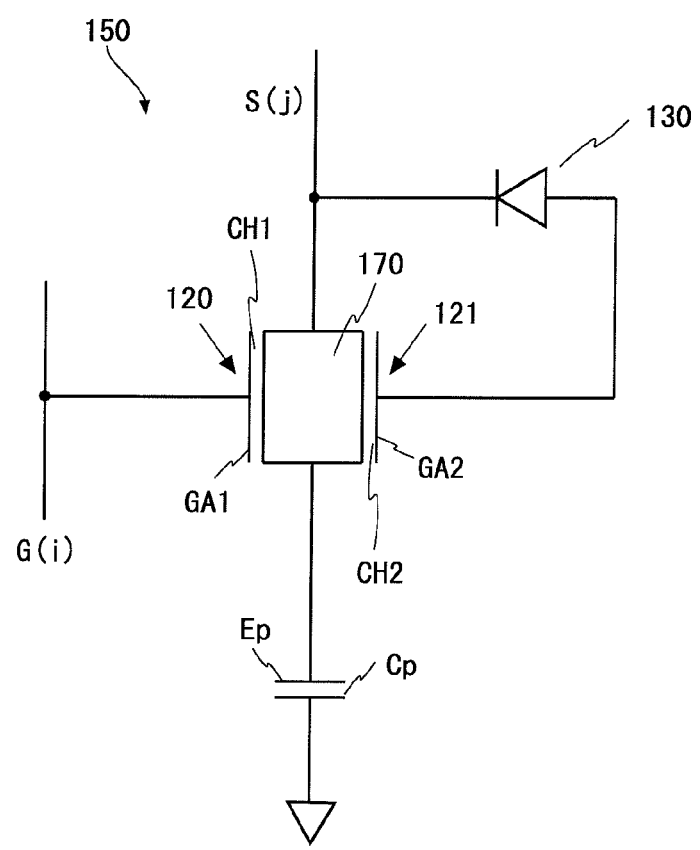
FIG. 3 is a circuit diagram showing an equivalent circuit of a TFT control circuit in the liquid crystal display device of FIG. 1.

FIG. 3 is a circuit diagram showing an equivalent circuit of the TFT control circuit 150. In an intrinsic silicon layer 170 in which the channel regions are formed of the TFT 120 in FIG. 3, in order to distinctly express a channel region on the side where a gate electrode GA1 is formed (hereinafter, called a "channel region CH1") and a channel region on the side of a back gate of the TFT 120 (hereinafter, called a "channel region CH2"), the electronic symbol as shown in FIG. 3 is used for convenience in the specification.

The gate electrode GA1 expresses the gate electrode of the TFT 120 using the scanning signal line G(i), and the gate electrode GA2 expresses the conductive plate 140 formed in the position opposed to the channel region CH2 via the interlayer insulating film. As described above, FIG. 3 shows that the n-channel type TFT 120 having the gate electrode GA1 and an n-channel type TFT 121 having the gate electrode GA2 are formed on both sides of the intrinsic silicon layer 170.

As described above, the cathode of the diode 130 is connected to the video signal line S(j), and the anode is connected to the gate electrode GA2 as the conductive plate 140.

In the embodiment, the n-channel type TFT refers to a TFT in which when positive voltage is applied to the gate electrode, an n-type channel layer is formed on the surface of the intrinsic silicon layer 170.

In the case where the potential of the video signal applied to the video signal line S(j) is lower than that of the conductive plate 140, the voltage applied to the diode 130 becomes a forward voltage. Consequently, a current flows to the video signal line S(j) from the conductive plate 140 until the potential of the conductive plate 140 becomes equal to that of the video signal line S(j), and the potential of the conductive plate 140 becomes equal to that of the video signal line S(j).

On the other hand, in the case where the potential of the video signal applied to the video signal line S(j) is higher than that of the conductive plate 140, the voltage applied to the diode 130 becomes an reverse voltage, so that no current flows. When the potential of the conductive plate 140 is higher than that of the video signal line S(j) as described above, the potential of the conductive plate 140 decreases until it becomes equal to that of the video signal line S(j). When the potential of the conductive plate 140 is lower than that of the video signal line S(j), the potential of the conductive plate 140 is held as it is.

As a result, the potential of the conductive plate 140 is clamped to the lowest potential among the potentials of the video signals applied to the video signal line S(j). Consequently, when a current is passed to the liquid crystal display device for long periods of time, formation of an inversion layer in the channel region CH2 by charges accumulated in the interlayer insulating film is suppressed. As described above, the diode 130 clamps the potential of the conductive plate 140 to the lowest value among the potentials of video signals applied to the video signal line S(j) and, when the TFT 120 is in the off state, passage of leak current from the drain electrode to the source electrode via the channel region CH2 is suppressed.

For example, in the case where the potential of the video signal applied to the video signal line S(j) changes in the range of 0 V to 15 V, depending on the magnitude relation between the potential of the video signal and the potential of the conductive plate 140, the forward voltage or the reverse voltage is applied to the diode 130, thereby clamping the potential of the conductive plate 140 finally to 0 V. More accurately, the diode 130 clamps the potential of the conductive plate 140 to the forward voltage (0.3 V to 0.7 V). However, in the following, description will be given on assumption that the diode 130 clamps the potential to 0 V.

<1.4 Arrangement of Wiring Layers forming TFT Control Circuit>

Figure 4:
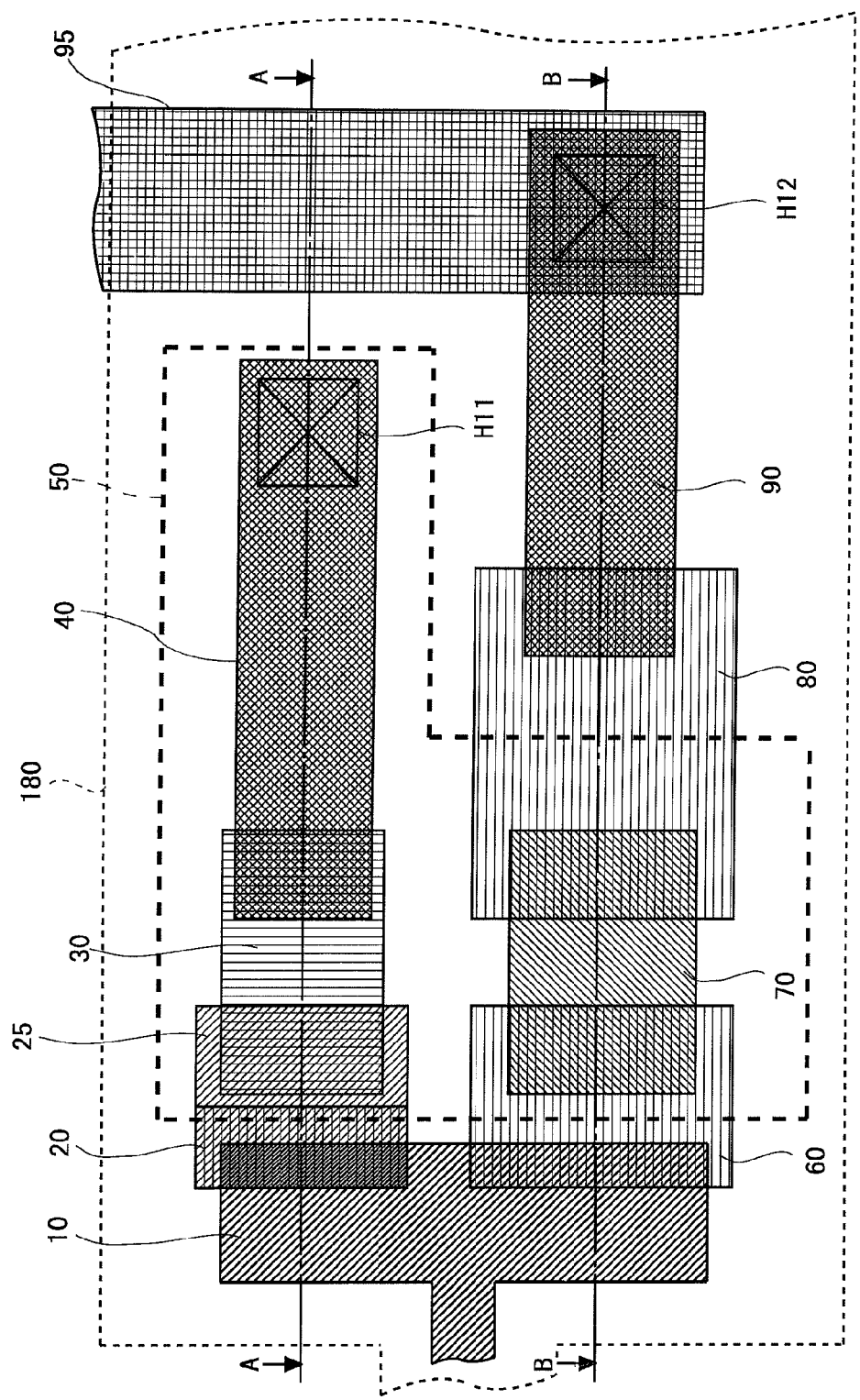
FIG. 4 is a plan view showing arrangement of wiring layers forming the TFT control circuit in the liquid crystal display device of FIG. 1.
Figure 5:
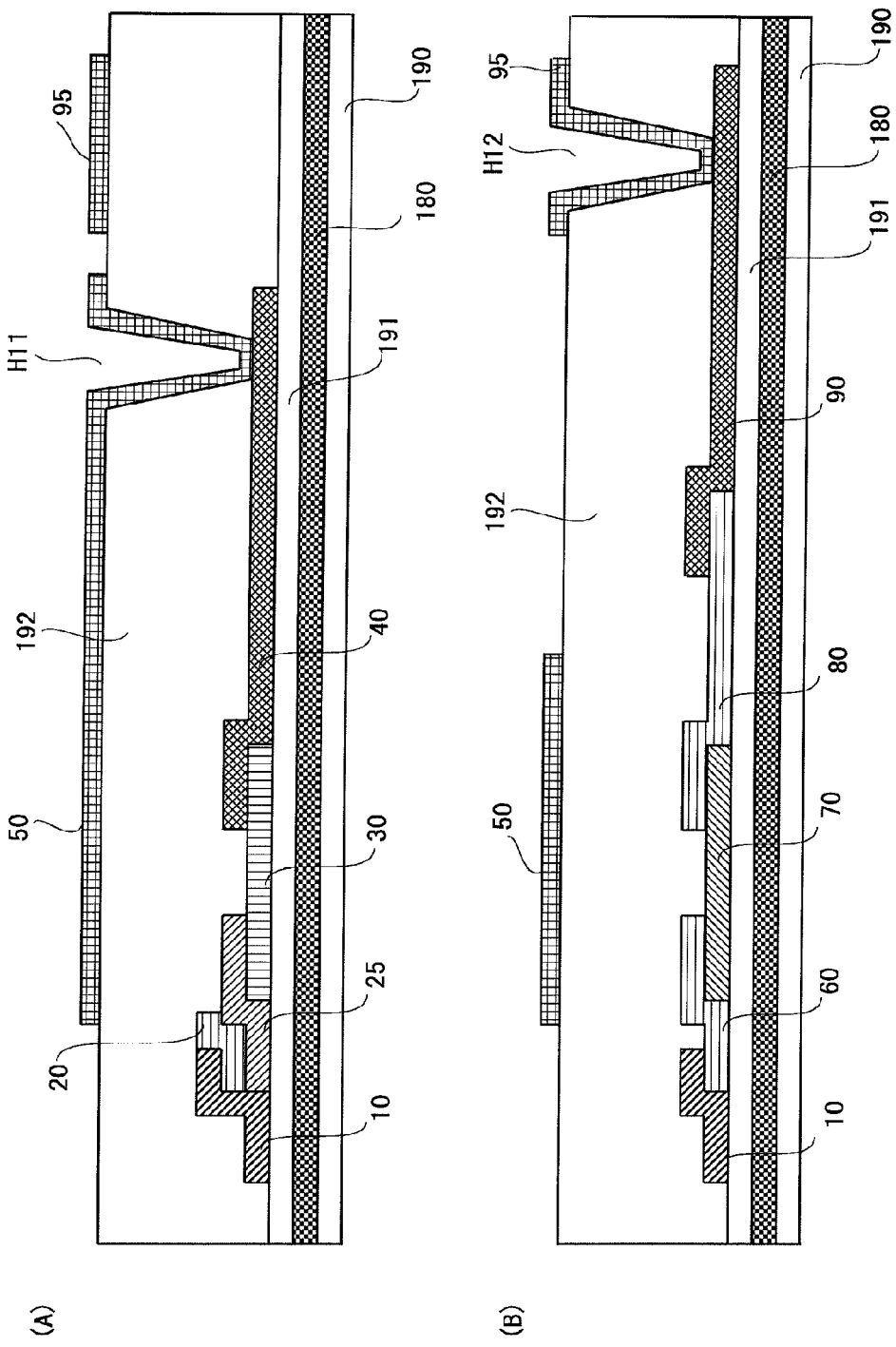
FIG. 5(A) is a cross-sectional view taken along line A-A of FIG. 4.
FIG. 5(B) is a cross-sectional view taken along line B-B of FIG. 4.

FIG. 4 is a plan view showing arrangement of wiring layers forming the TFT control circuit 150. FIG. 5(A) is a cross-sectional view taken along line A-A of FIG. 4, and FIG. 5(B) is a cross-sectional view taken along line B-B of FIG. 4.

Referring to FIGS. 4, 5(A), and 5(B), the arrangement of the wiring layers constructing the TFT 120 and the diode 130 included in the TFT control circuit 150 will be described. At the time of forming wiring layers of the TFT control circuit 150, first, a wiring layer constructing the TFT 120 is formed so that the characteristic of the TFT 120 does not change and, next, a wiring layer constructing the diode 130 is formed.

On an insulating transparent substrate 190 as the substrate of the liquid crystal panel 100, a wiring layer 180 also functioning as the gate electrode of the TFT 120 is formed. On an insulating film 191 formed on the surface of the wiring layer 180 and also functioning as the gate insulating film of the TFT 120, a channel layer 70 made of intrinsic silicon is formed. To the top face of one end of the channel layer 70, the under face of one end of an n$^+$ silicon layer 60 is connected. The under face of an n$^+$silicon layer 80 is connected to the top face of the other end of the channel layer 70, and the under face of one end of a drain output wiring layer 90 is connected to the top face of the other end of the n$^+$ silicon layer 80. The other end of the drain output wiring layer 90 is connected to a metal layer 95 which becomes the pixel electrode Ep formed on the surface of an interlayer insulating film 192 via a through hole H12 opened in the interlayer insulating film 192.

In such a manner, the n-channel type TFT 120 is formed in which the region where the n$^+$ silicon layer 60 and the channel layer 70 overlap is used as the source electrode, the region where the n$^+$ silicon layer 80 and the channel layer 70 overlap is used as the drain electrode, and the region in the channel layer 70 which is not overlapped with the n$^+$ silicon layers 60 and 80 is used as the channel region. The source electrode of the TFT 120 is connected to the video signal line via a source input wiring layer 10 which will be described later, and the drain electrode is connected to the metal layer 95 via the drain output wiring layer 90.

Next, a p$^+$ silicon layer 30 is formed on the insulating film 191, and an n$^-$silicon layer 25 is connected on the top face of one end of the p$^+$ silicon layer 30. An n$^+$ silicon layer 20 is formed on the top surface of one end of the n$^-$ silicon layer 25 so as to be connected to the n$^-$ silicon layer 25 and, further, the under face of the source input wiring layer 10 which is partly overlapped is connected to the top face of the n$^+$ silicon layers 20 and 60. To the top face of the other end of the p$^+$ silicon layer 30, the under face of one end of a wiring layer 40 is connected. The other end of the wiring layer 40 is connected to a metal layer 50 formed on the surface of the interlayer insulating film 192 via a through hole H11 opened in the interlayer insulating film 192.

A pn junction diode in which the $n^+$ silicon layer 20 and the $n^-$ silicon layer 25 formed in such a manner function as the cathode, and the $p^+$ silicon layer 30 functions as the anode is formed. The metal layer 50 is formed so as to function as the conductive plate 140 and cover the TFT 120.

The under face of the $n^+$ silicon layer 20 may be directly connected to the top face of one end of the $p^+$ silicon layer 30 not via the $n^-$ silicon layer 25. However, the impurity concentration of both of the $n^+$ silicon layer 20 and the $p^+$ silicon layer 30 forming the pn junction is high. Consequently, when an reverse voltage is applied to the pn junction diode, a breakdown easily occurs at a low voltage. To prevent it, the $n^+$ silicon layer 20 and the $p^+$ silicon layer 30 are connected via the $n^-$ silicon layer 25. In this case, even when the reverse voltage is applied to the diode 130, the $n^-$ silicon layer 25 lessens the electric field intensity of the pn junction, so that the reverse breakdown voltage of the pn junction diode is maintained high.

In the embodiment, for example, each of the video signal line including the source input wiring layer 10 and the scanning signal line is formed by a single-layer film made of ITO (Indium Tin Oxide), IZO (Indium Zinc Oxide), molybdenum (Mo), aluminum (Al), or the like or a stack film obtained by properly combining them. Each of the $n^-$ silicon layer 25, the $n^+$ silicon layers 20, 60, and 80, the $p^+$ silicon layer 30, and the channel layer 70 is formed of amorphous silicon, and the interlayer insulating film 192 is formed by an organic insulating film made of polyimide or the like. The metal layer 50 serving as the conductive plate 140 and the wiring layers 40 and 90 are made of ITO, IZO, molybdenum, aluminum, or the like, and the metal layer 95 serving as the pixel electrode Ep is made of ITO, IZO, or the like.

The video signal line including the source input wiring layer 10 and the scanning signal line may be also formed of amorphous silicon. The video signal line including the source input wiring layer 10, the scanning signal line, the $n^-$ silicon layer 25, the $n^+$ silicon layers 20, 60, and 80, the $p^+$ silicon layer 30, and the channel layer 70 may be formed of polycrystalline silicon or CG (Continuous Grain) silicon. As the interlayer insulating film 192, a silicon nitride film formed by plasma CVD (plasma enhanced chemical vapor deposition) or the like may be used.

<1.5 Effects>

As described above, the conductive plate 140 is formed on the surface of the interlayer insulating film 192 so as to cover the TFT 120. The anode of the diode (pn junction diode) 130 is connected to the conductive plate 140, and the cathode is connected to the source input unit 160 branched from the video signal line. In the case where the potential of the video signal line is lower than that of the conductive plate 140, the forward voltage is applied to the diode 130. Consequently, a current flows from the conductive plate 140 to the source input unit 160, and the potential of the conductive plate 140 becomes equal to that of the video signal line. On the other hand, in the case where the potential of the video signal line is higher than that of the conductive plate 140, the reverse voltage is applied to the diode 130, so that no current flows. Consequently, the potential of the conductive plate 140 is held as it is. In such a manner, the diode 130 clamps the potential of the conductive plate 140 to the lowest potential among the potentials of video signals applied to the video signal line, and suppresses flow of leak current from the drain electrode to the source electrode via the channel region CH2 when the TFT 120 is in the off state. Therefore, the liquid crystal display device can suppress a change in the off characteristic of the TFT 120 and display a high-quality video image even when the current passage time becomes long.

Since the area of the pixel electrode Ep does not change even when the diode 130 is formed on the scanning signal line in the pixel formation portion 110, without decreasing the aperture ratio of the liquid crystal panel 100, a change in the off characteristic of the TFT 120 can be suppressed.

<1.6 Modification>

It is sufficient to form the metal layer 50 serving as the conductive plate 140 so as to cover at least the channel layer 70 interposed between the $n^+$ silicon layers 60 and 80. The metal layer 50 does not have to cover the entire TFT 120. That is, it is sufficient to form the metal layer 5Q so as to cover at least the channel region in the TFT 120. The metal layer 50 may be formed on the top face of the orientation film formed on the surface of the interlayer insulating film 192.

<2. Second Embodiment>

<2.1 Configuration of Liquid Crystal Display Device>

Figure 6:
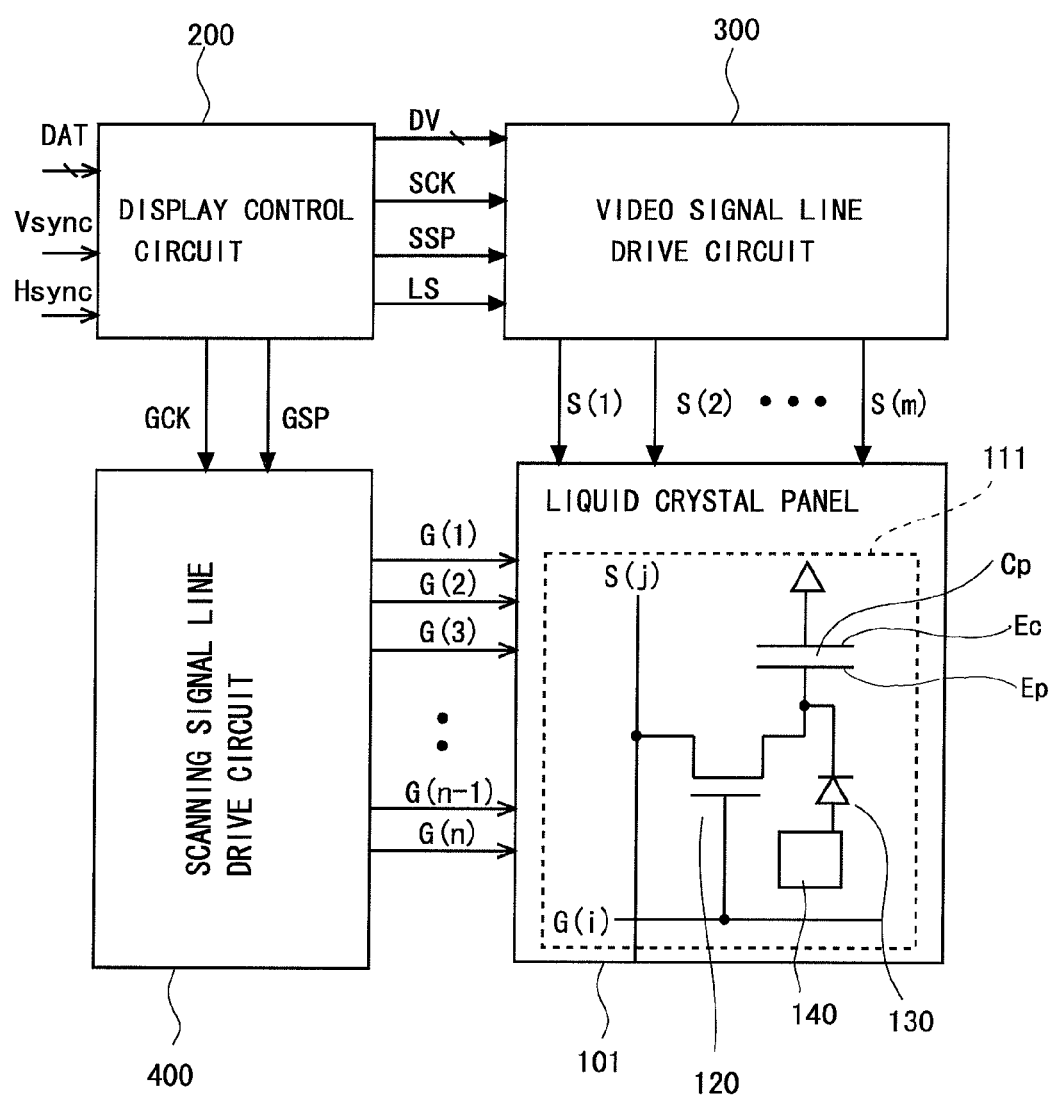
FIG. 6 is a block diagram showing a configuration of an active matrix-type liquid crystal display device according to a second embodiment of the present invention.

FIG. 6 is a block diagram showing the configuration of an active matrix-type liquid crystal display device according to a second embodiment of the present invention. In the liquid crystal display device shown in FIG. 6, the same reference numerals are designated to the same or corresponding components as those of the liquid crystal display device according to the first embodiment, and points different from the first embodiment will be described mainly.

As shown in FIG. 6, the liquid crystal display device has, like the liquid crystal display device of the first embodiment, a liquid crystal panel 101, the display control circuit 200, the video signal line drive circuit 300, and the scanning signal line drive circuit 400. Each of pixel formation portions 111 in the liquid crystal panel 101 includes the TFT 120, the pixel electrode Ep, the common electrode Ec, a liquid crystal layer (not shown) sandwiched between the pixel electrode Ep and the common electrode Ec, the conductive plate 140 disposed so as to cover the TFT 120, and the diode 130. By the pixel electrode Ep, the common electrode Ec, and the liquid crystal layer, the pixel capacitance Cp is constructed. In the liquid crystal display device, the anode of the diode 130 is connected to the conductive plate 140 like in the case of the first embodiment, and the cathode is connected to the pixel electrode Ep different from the case of the first embodiment.

<2.2 Configuration of Pixel Formation Portion>

Figure 7:
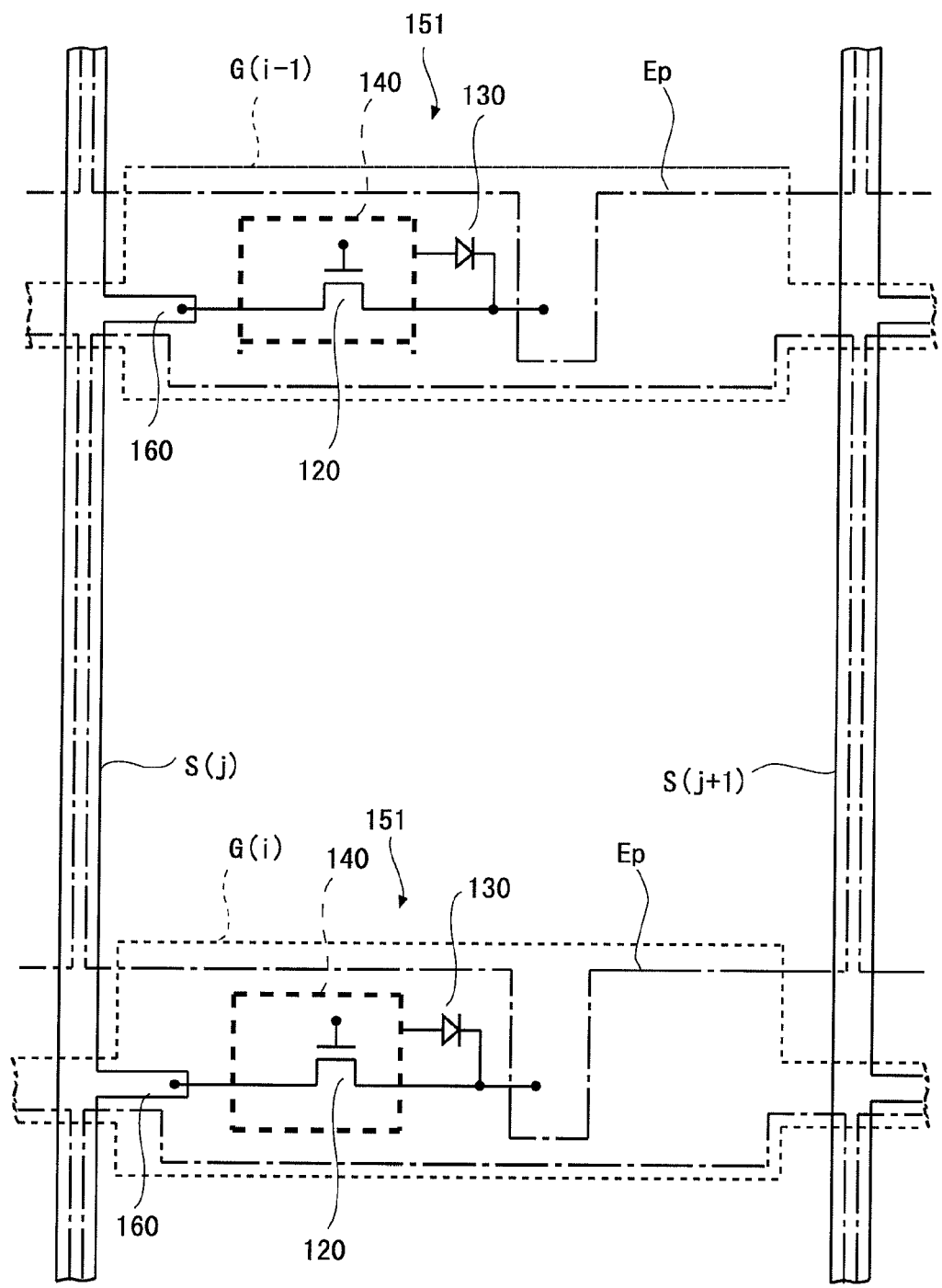
FIG. 7 is an enlarged plan view showing a configuration of a pixel formation portion in the liquid crystal display device of FIG. 6.

FIG. 7 is an enlarged plan view of the pixel formation portion 111 formed in the liquid crystal panel 101. As shown in FIG. 7, the video signal lines S(j) and S(j+1), the scanning signal lines G(i-1) and G(i), and the pixel electrode Ep are formed in the same positional relation as that in the liquid crystal panel 100 of the first embodiment.

In such a pixel formation portion 111, TFT control circuits 151 each constructed by the TFT 120, the diode 130, and the conductive plate 140 are formed on the scanning signal lines G(i-1) and G(i) near the intersections between the video signal line S(j) and the scanning signal lines G(i-1) and G(i).

In the TFT control circuit 151, the source electrode and the drain electrode of the TFT 120 and the anode of the diode 130 are connected in a manner similar to those in the TFT control circuit 150 of the first embodiment, and each of the scanning signal lines G(i-1) and G(i) formed below the TFT 120 via an insulating film also functions as the gate electrode of the TFT 120. However, in the TFT control circuit 151, different from the case of the TFT control circuit 150, the cathode of the diode 130 is connected to the pixel electrode Ep via the drain electrode of the TFT 120.

<2.3 Equivalent Circuit of TFT Control Circuit>

Figure 8:
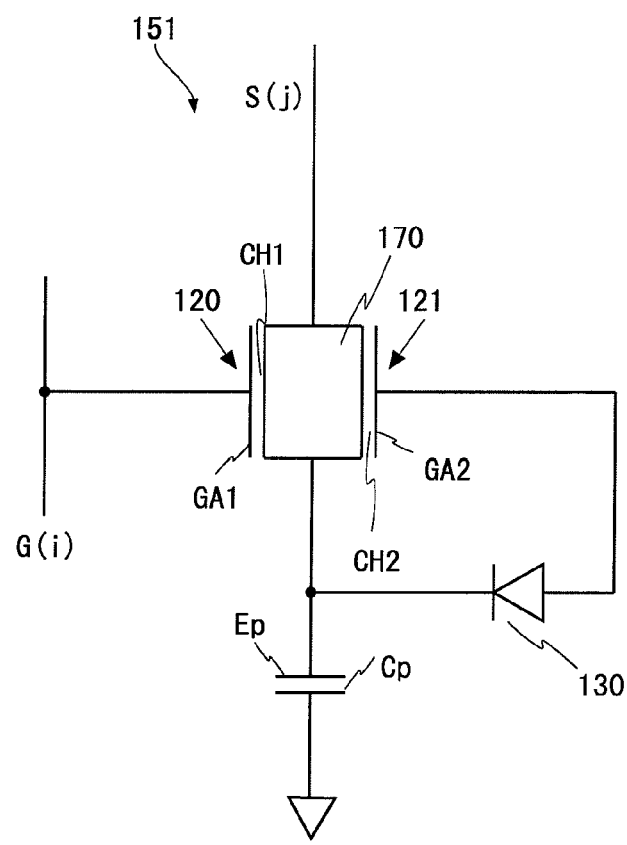
FIG. 8 is a circuit diagram showing an equivalent circuit of a TFT control circuit in the liquid crystal display device of FIG. 6.

FIG. 8 is a circuit diagram showing an equivalent circuit of the TFT control circuit 151. The electronic symbol expressing the TFT 120 in FIG. 8 is a symbol used for convenience in the specification as described in FIG. 3. As shown in FIG. 8, the gate electrode GA1 expresses the gate electrode of the TFT 120 using the scanning signal line G(i), and the gate electrode GA2 expresses the conductive plate 140 formed so as to oppose to the channel region CH2 via the interlayer insulating film 192. That is, FIG. 8 shows that the TFT 120 having the gate electrode GA1 and the TFT 121 having the gate electrode GA2 are formed on both surfaces of the intrinsic silicon layer 170.

As described above, the cathode of the diode 130 is connected to the pixel electrode Ep, and the anode is connected to the gate electrode GA2 as the conductive plate 140. In the embodiment, the n-channel type TFT refers to a TFT in which when a positive voltage is applied to the gate electrode, an n-type channel layer is formed on the surface of the intrinsic silicon layer 170.

In the case where the potential of the video signal applied to the pixel electrode Ep is lower than that of the conductive plate 140, the voltage applied to the diode 130 becomes a forward voltage. Consequently, a current flows from the conductive plate 140 to the pixel electrode Ep until the potential of the conductive plate 140 becomes equal to that of the pixel electrode Ep, and the potential of the conductive plate 140 becomes equal to that of the pixel electrode Ep.

On the other hand, in the case where the potential of the video signal applied to the pixel electrode Ep is higher than that of the conductive plate 140, the voltage applied to the diode 130 becomes an reverse voltage, so that no current flows. When the potential of the conductive plate 140 is higher than that of the pixel electrode Ep as described above, the potential of the conductive plate 140 decreases until it becomes equal to that of the pixel electrode Ep. When the potential of the conductive plate 140 is lower than that of the pixel electrode Ep, the potential of the conductive plate 140 is held as it is.

As a result, the potential of the conductive plate 140 is clamped to the lowest potential among the potentials of the video signals applied to the pixel electrode Ep. Consequently, when a current is passed to the liquid crystal display device for long periods of time, formation of an inversion layer in the channel region CH2 by charges accumulated in the interlayer insulating film is suppressed. As described above, the diode 130 clamps the potential of the conductive plate 140 to the lowest value among the potentials of video signals supplied to the pixel electrode Ep and, when the TFT 120 is in the off state, passage of leak current from the drain electrode to the source electrode via the channel region CH2 is suppressed.

For example, in the case where the potential of the video signal applied to the video signal line S(j) changes in the range of 0 V to 15 V, the potential of the pixel electrode Ep changes in the range of 0 V to 15 V. Consequently, the diode 130 clamps the potential of the conductive plate 140 finally to 0 V by application of the forward voltage or the reverse voltage depending on the magnitude relation between the potential of the pixel electrode Ep and the potential of the conductive plate 140. More accurately, the diode 130 clamps the potential of the conductive plate 140 to the forward voltage (0.3 V to 0.7 V). However, in the following, description will be given on assumption that the diode 130 clamps the potential to 0 V.

<2.4 Arrangement of Wiring Layers forming TFT Control Circuit>

Figure 9:
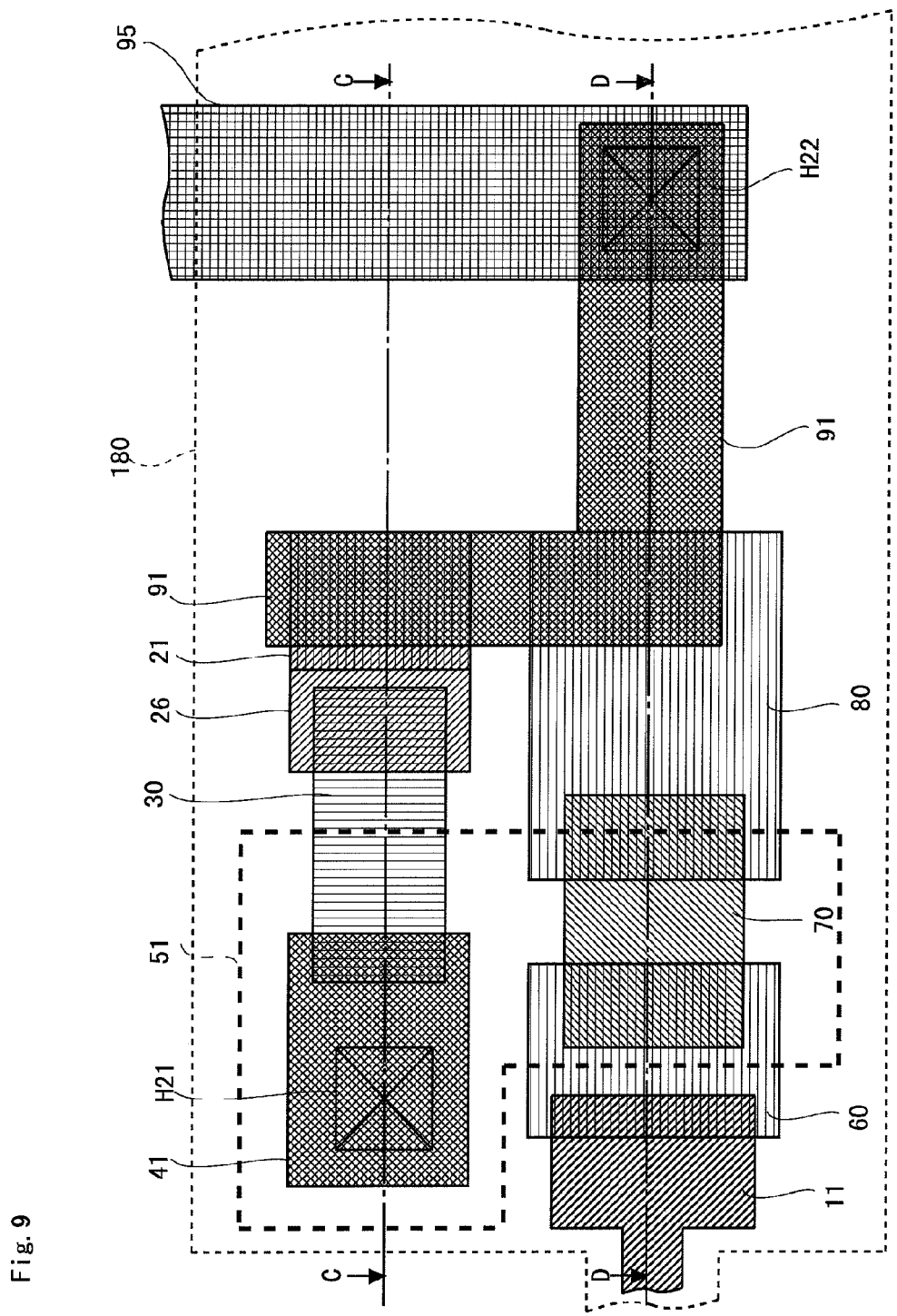
FIG. 9 is a plan view showing arrangement of wiring layers forming the TFT control circuit in the liquid crystal display device of FIG. 6.
Figure 10:
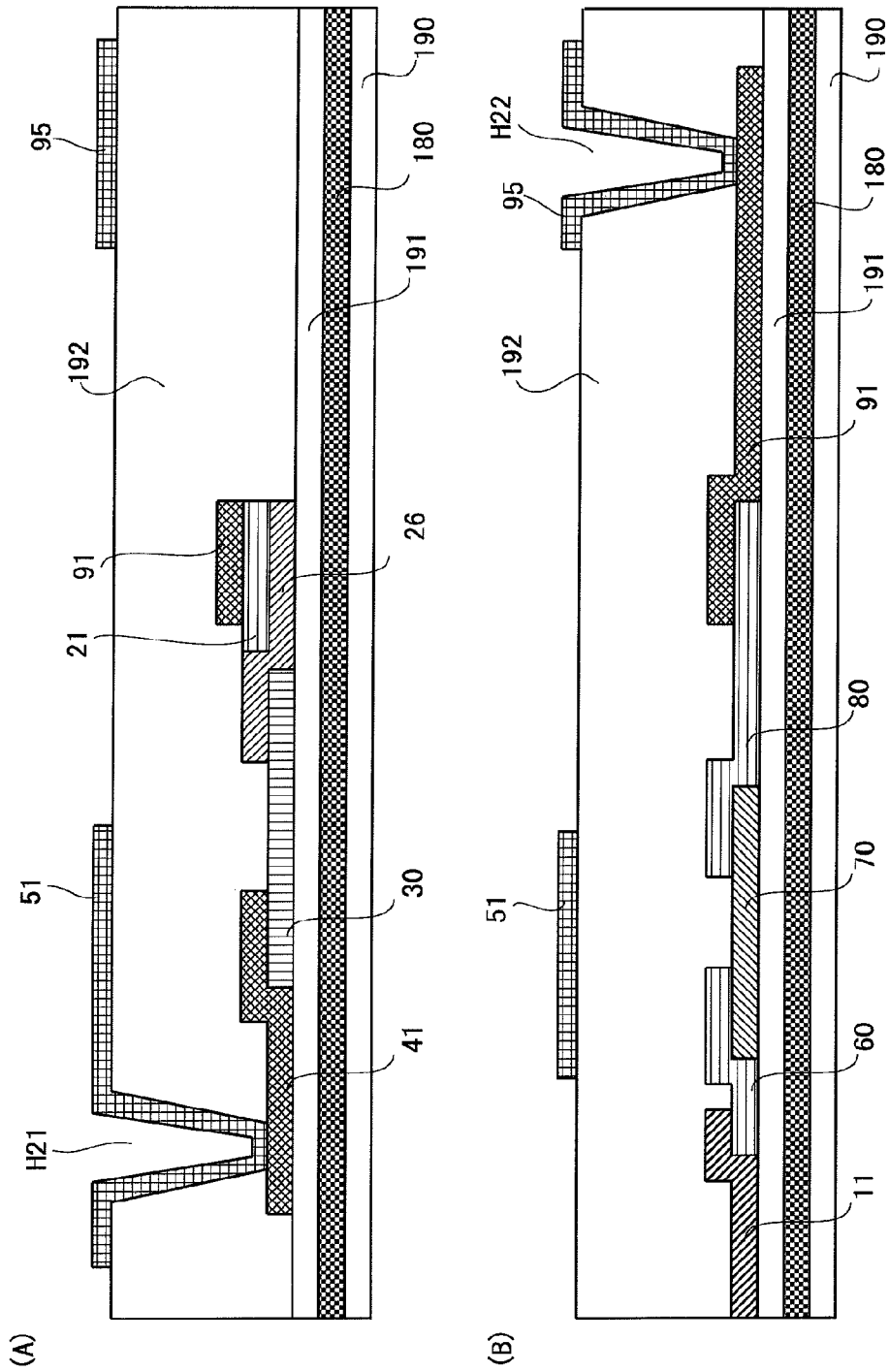
FIG. 10(A) is a cross-sectional view taken along line C-C of FIG. 9.
FIG. 10(B) is a cross-sectional view taken along line D-D of FIG. 9.

FIG. 9 is a plan view showing arrangement of wiring layers forming the TFT control circuit 151. FIG. 10(A) is a cross-sectional view taken along line C-C of FIG. 9, and FIG. 10(B) is a cross-sectional view taken along line D-D of FIG. 9.

Referring to FIGS. 9, 10(A), and 10(B), the arrangement of the wiring layers constructing the TFT 120 and the diode 130 included in the TFT control circuit 151 will be described. At the time of forming wiring layers of the TFT control circuit 151, first, a wiring layer constructing the TFT 120 is formed so that the characteristic of the TFT 120 does not change and, next, a wiring layer constructing the diode 130 is formed.

On the insulating transparent substrate 190 as the substrate of the liquid crystal panel 101, the wiring layer 180 also functioning as the gate electrode of the TFT 120 is formed. On the insulating film 191 formed on the surface of the wiring layer 180 and also functioning as the gate insulating film of the TFT 120, the channel layer 70 is formed. To the top face of one end of the channel layer 70, the under face of one end of an $n^+$ silicon layer 60 is connected. A partially overlapped source input wiring layer 11 is connected to the top face of the other end of the $n^+$ silicon layer 60. The under face of one end of an $n^+$ silicon layer 80 is connected to the top face of the other end of the channel layer 70. The under face of the drain output wiring layer 91 is connected to the top face of the other end of the $n^-$ silicon layer 80. One end of the drain output wiring layer 91 is connected the top face of an $n^+$ silicon layer 21 which will be described later, and the other end extends to a position just below a through hole H22 opened in the interlayer insulating film 192. The other end of the drain output wiring layer 91 is connected to the metal layer 95 serving as the pixel electrode Ep formed on the top face of the interlayer insulating film 192 via the through hole H22 opened in the interlayer insulating film 192.

In such a manner, the n-channel type TFT 120 is formed in which the region where the $n^+$ silicon layer 60 and the channel layer 70 overlap is used as the source electrode, the region where the $n^+$ silicon layer 80 and the channel layer 70 overlap is used as the drain electrode, and the region in the channel layer 70 which is not overlapped with the $n^+$ silicon layers 60 and 80 is used as the channel region. The source electrode of the TFT 120 is connected to the video signal line via the source input wiring layer 11, and the drain electrode is connected to the metal layer 95 via the drain output wiring layer 91.

Next, the $p^+$ silicon layer 30 is formed on the insulating film 191, and the under face of one end of a wiring layer 41 is connected to the top face of one end of the $p^+$ silicon layer 30. The other end of the wiring layer 41 is connected to the metal layer 51 as the conductive plate 140 formed on the top face of the wiring layer 41 via the through hole H21 opened in the interlayer insulating film 192. The under face of one end of the $n^-$ silicon layer 26 is connected to the top face of the other end of the $p^+$ silicon layer 30, and the $n^+$ silicon layer 21 is formed on the top face of the other end of the $n^-$ silicon layer 26. The top face of the $n^+$ silicon layer 21 is connected to the under face of one end of the drain output wiring layer 91.

In such a manner, a pn junction diode in which the $n^+$ silicon layer 21 and the $n^-$ silicon layer 26 function as the cathode, and the $p^+$ silicon layer 30 functions as the anode is formed. The metal layer 51 is formed so as to function as the conductive plate 140 and cover the TFT 120. Although the $p^+$ silicon layer 30 and the $n^+$ silicon layer 21 can be directly connected to each other like in the case of the first embodiment, in this case, when a voltage in the reverse direction is applied to the pn junction diode, breakdown easily occurs in the pn junction diode with a low voltage.

In the embodiment, like in the case of the first embodiment, each of the video signal line including the source input wiring layer 11 and the scanning signal line is formed by a single-layer film made of ITO, IZO, molybdenum, aluminum, or the like or a stack film obtained by properly combining them. Each of the n⁻ silicon layer 26, the n⁺ silicon layers 21, 60, and 80, the p⁺ silicon layer 30, and the channel layer 70 is formed of amorphous silicon, and the interlayer insulating film 192 is formed by an organic insulating film made of polyimide or the like. The metal layer 51 serving as the conductive plate 140 and the wiring layers 41 and 91 are made of ITO, IZO, molybdenum, aluminum, or the like, and the metal layer 95 serving as the pixel electrode Ep is made of ITO, IZO, or the like.

The video signal line including the source input wiring layer 11 and the scanning signal line may be also formed of amorphous silicon. The video signal line including the source input wiring layer 11, the scanning signal line, then silicon layer 26, the n⁺ silicon layers 21, 60, and 80, the p⁺ silicon layer 30, and the channel layer 70 may be formed of polycrystalline silicon or CG silicon. As the interlayer insulating film 192, a silicon nitride film formed by plasma CVD or the like may be used.

<2.5 Effects>

As described above, the conductive plate 140 is formed on the surface of the interlayer insulating film 192 so as to cover the TFT 120. The anode of the diode (pn junction diode) 130 is connected to the conductive plate 140, and the cathode is connected to the pixel electrode Ep. In the case where the potential of the video signal line applied to the pixel electrode Ep is lower than that of the conductive plate 140, the forward voltage is applied to the diode 130. Consequently, a current flows from the conductive plate 140 to the pixel electrode Ep, and the potential of the conductive plate 140 becomes equal to that of the pixel electrode Ep. On the other hand, in the case where the potential of the video signal is higher than that of the conductive plate 140, the reverse voltage is applied to the diode 130, so that no current flows. Consequently, the potential held on the conductive plate 140 is held as it is. In such a manner, the diode 130 clamps the potential of the conductive plate 140 to the lowest potential among the potentials of video signals applied to the pixel electrode Ep, and suppresses flow of leak current from the drain electrode to the source electrode when the TFT 120 is in the off state. Therefore, the liquid crystal display device can suppress a change in the off characteristic of the TFT 120 and display a high-quality video image even when the current passage time becomes long.

Since the area of the pixel electrode Ep does not change even when the diode 130 is formed on the scanning signal line in the pixel formation portion 111, without decreasing the aperture ratio of the liquid crystal panel 101, a change in the off characteristic of the TFT 120 can be suppressed.

<2.6 Modification>

Figure 11:
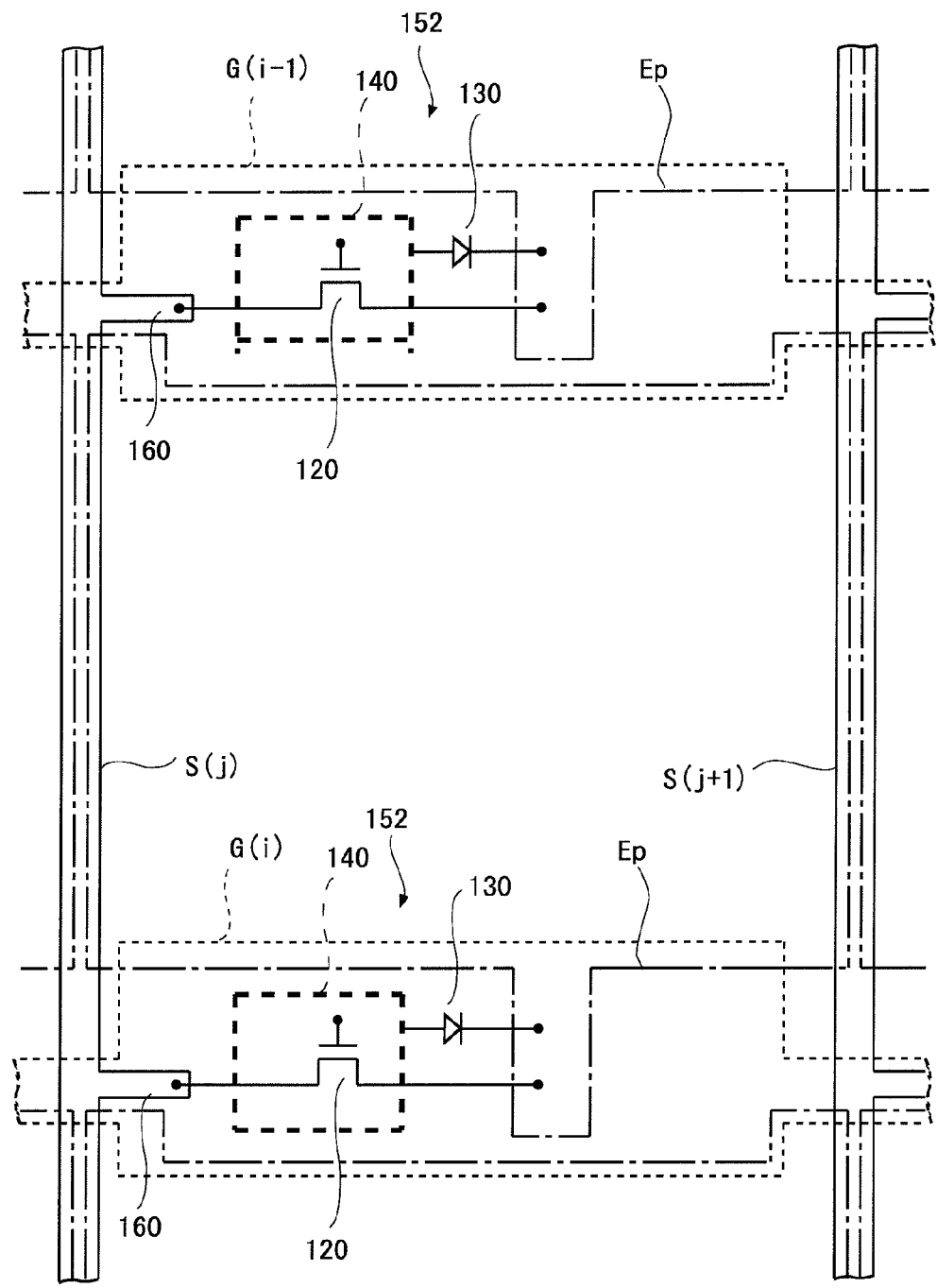
FIG. 11 is an enlarged plan view showing a configuration of a pixel formation portion in a modification of the liquid crystal display device of FIG. 6.

FIG. 11 is an enlarged plan view of the pixel formation portion 111 formed in the liquid crystal panel 101 in a modification of the liquid crystal display device of the embodiment. As shown in FIG. 11, the video signal lines S(j) and S(j+1), the scanning signal lines G(i-1) and G(i), and the pixel electrode Ep are formed in the same positional relation as that in the liquid crystal panel 101 of the second embodiment.

In such a pixel formation portion 111, TFT control circuits 152 each constructed by the TFT 120, the diode 130, and the conductive plate 140 are formed on the scanning signal lines G(i-1) and G(i) near the intersections between the video signal line S(j) and the scanning signal lines G(i-1) and G(i).

In the TFT control circuit 152, the source electrode and the drain electrode of the TFT 120 and the cathode of the diode 130 are connected in a manner similar to those in the TFT control circuit 151 of the second embodiment, and each of the scanning signal lines G(i-1) and G(i) formed below the TFT 120 via an insulating film also functions as the gate electrode of the TFT 120. However, in the TFT control circuit 152, different from the case of the TFT control circuit 151, the anode of the diode 130 is connected directly to the pixel electrode Ep.

Figure 12:
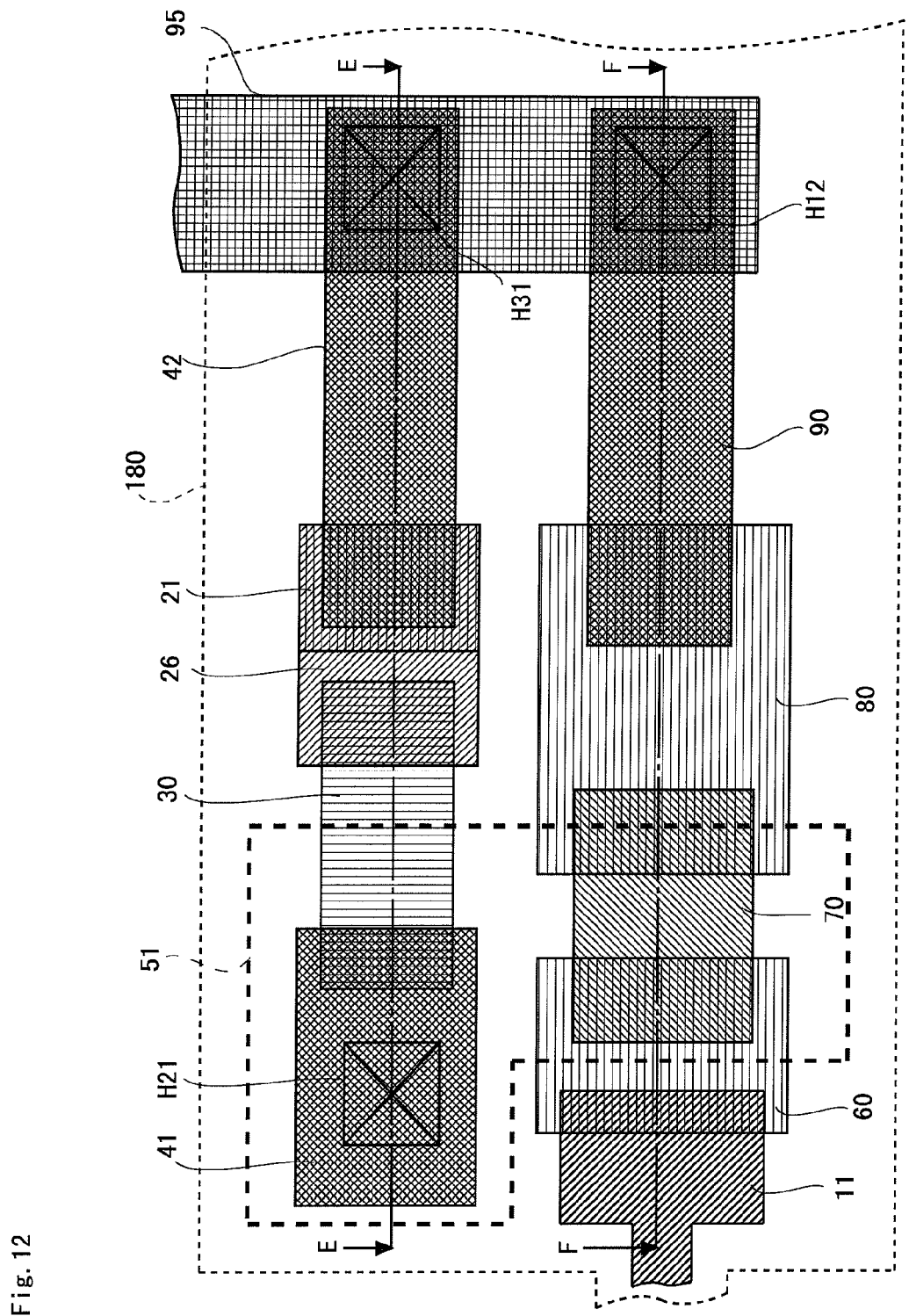
FIG. 12 is a plan view showing arrangement of wiring layers forming the TFT control circuit in the liquid crystal display device according to the modification of the second embodiment.
Figure 13:
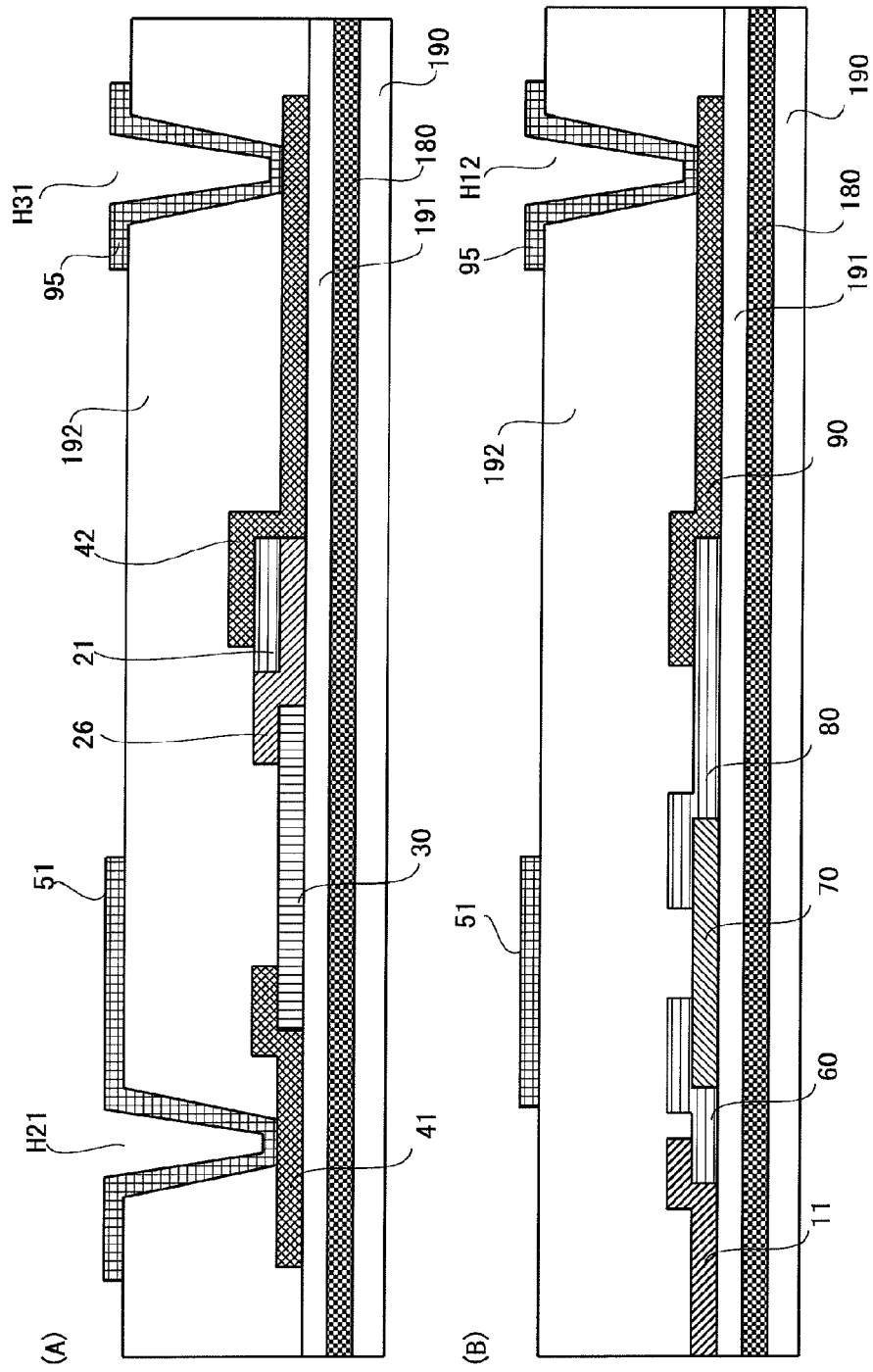
FIG. 13(A) is a cross-sectional view taken along line E-E of FIG. 12.
FIG. 13(B) is a cross-sectional view taken along line F-F of FIG. 12.

FIG. 12 is a plan view showing arrangement of wiring layers forming the TFT control circuit 152. FIG. 13(A) is a cross-sectional view taken along line E-E of FIG. 12, and FIG. 13(B) is a cross-sectional view taken along line F-F of FIG. 12. The same reference numerals are designated to parts in the TFT control circuit 152 shown in FIGS. 12, 13(A), and 13(B), which are the same or corresponding components as those of the TFT control circuit 151 shown in FIGS. 9, 10(A), and 10(B). In the following, points different from the arrangement of the wiring layers in the TFT control circuit 151 shown in FIGS. 9, 10(A), and 10(B), of the TFT control circuit 152 will be described mainly.

In a manner similar to the case of the second embodiment, first, the n⁺ silicon layers 60 and 80 and the channel layer 70 of the TFT 120 are formed. Since the arrangement of these wiring layers is the same as that of the wiring layers of the TFT control circuit 151 shown in FIGS. 9, 10(A), and 10(B), the description will not be repeated.

Next, the p⁺ silicon layer 30 is formed on the insulating film 191. The under face of one end of the wiring layer 41 is connected to the top face of one end of the p⁺ silicon layer 30. The other end of the wiring layer 41 is connected to the metal layer 51 as the conductive plate 140 formed on the top face of the wiring layer 41 via the through hole H21 opened in the interlayer insulating film 192. The under face of the n⁻ silicon layer 26 is connected to the top face of the other end of the p⁺ silicon layer 30, and the n⁺ silicon layer 21 is formed on the top face of the n⁻ silicon layer 26. To the top face of the n⁺ silicon layer 21, the under face of one end of a wiring layer 42 is connected. The other end of the wiring layer 42 is connected to the metal layer 95 serving as the pixel electrode Ep formed on the surface of the interlayer insulating film 192 via a through hole H31 formed in the interlayer insulating film 192.

In the arrangement of the wiring layers of the TFT control circuit 152 in the modification, the n⁺ silicon layer 21 serving as the cathode of the pn junction diode is directly connected to the metal layer 95 via the through hole H31 newly provided.

<2.7 Other Modifications>

It is sufficient to form the metal layer 51 serving as the conductive plate 140 so as to cover at least the channel layer 70 interposed between the n⁺ silicon layers 60 and 80 in a manner similar to the case of the first embodiment. The metal layer 51 does not have to cover the entire TFT 120. That is, it is sufficient to form the metal layer 51 so as to cover at least the channel region in the TFT 120. The metal layer 51 may be formed on the top face of the orientation film formed on the top face of the interlayer insulating film 192.

<3. Third Embodiment>

<3.1 Configuration of Liquid Crystal Display Device>

Figure 14:
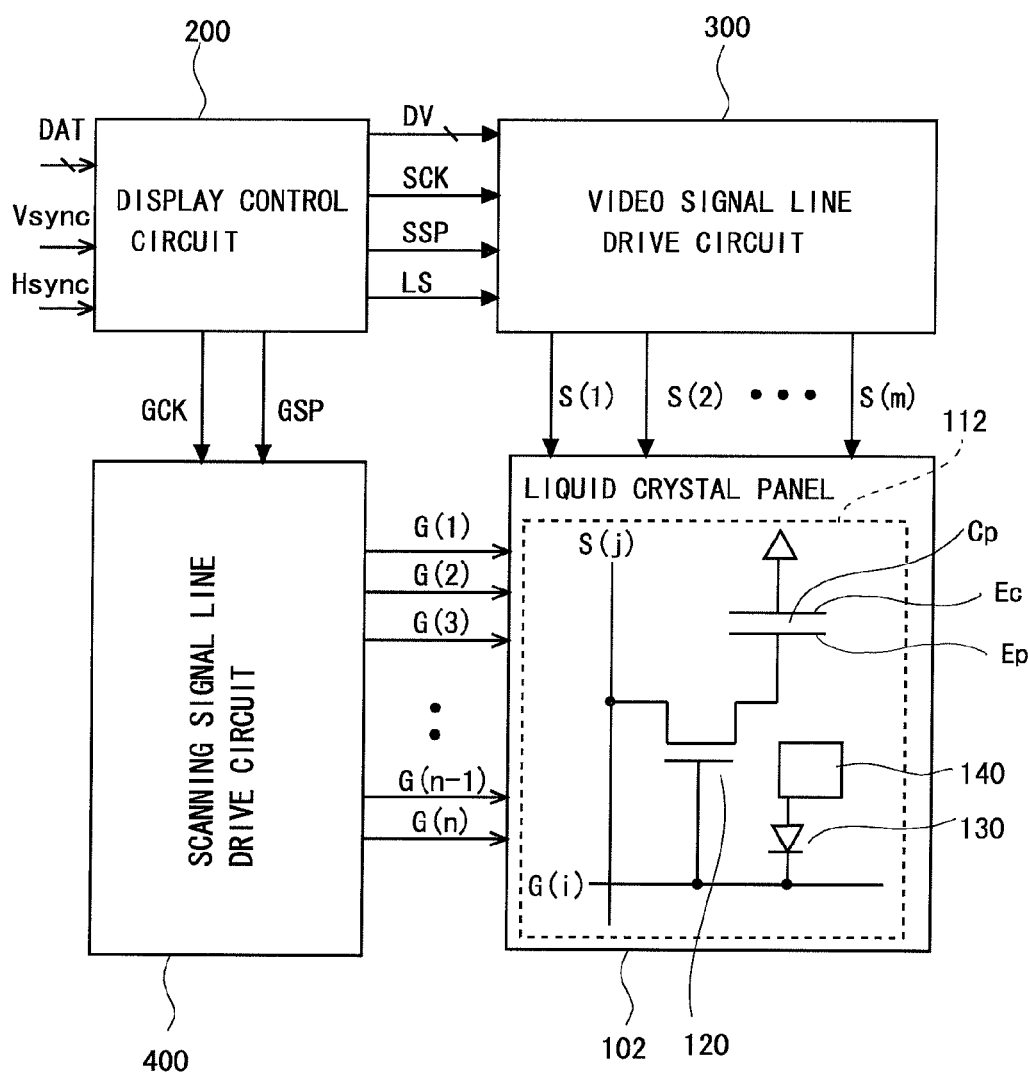
FIG. 14 is a block diagram showing a configuration of an active matrix-type liquid crystal display device according to a third embodiment of the present invention.

FIG. 14 is a block diagram showing the configuration of an active matrix-type liquid crystal display device according to a third embodiment of the present invention. In the liquid crystal display device shown in FIG. 14, the same reference numerals are designated to the same or corresponding components as those of the liquid crystal display device according to the first embodiment. In the following, points different from the first embodiment will be described mainly.

As shown in FIG. 14, the liquid crystal display device has, like the liquid crystal display device of the first embodiment, a liquid crystal panel 102, the display control circuit 200, the video signal line drive circuit 300, and the scanning signal line drive circuit 400. Each of pixel formation portions 112 in the liquid crystal panel 102 includes the TFT 120, the pixel electrode Ep, the common electrode Ec, a liquid crystal layer (not shown) sandwiched between the pixel electrode Ep and the common electrode Ec, the conductive plate 140 disposed so as to cover the TFT 120, and the diode 130. By the pixel electrode Ep, the common electrode Ec, and the liquid crystal layer, the pixel capacitance Cp is constructed. In the liquid crystal display device, the anode of the diode 130 is connected to the conductive plate 140 like in the case of the first embodiment, and the cathode is connected to the scanning signal line G(i) different from the case of the first embodiment.

<3.2 Configuration of Pixel Formation Portion>

Figure 15:
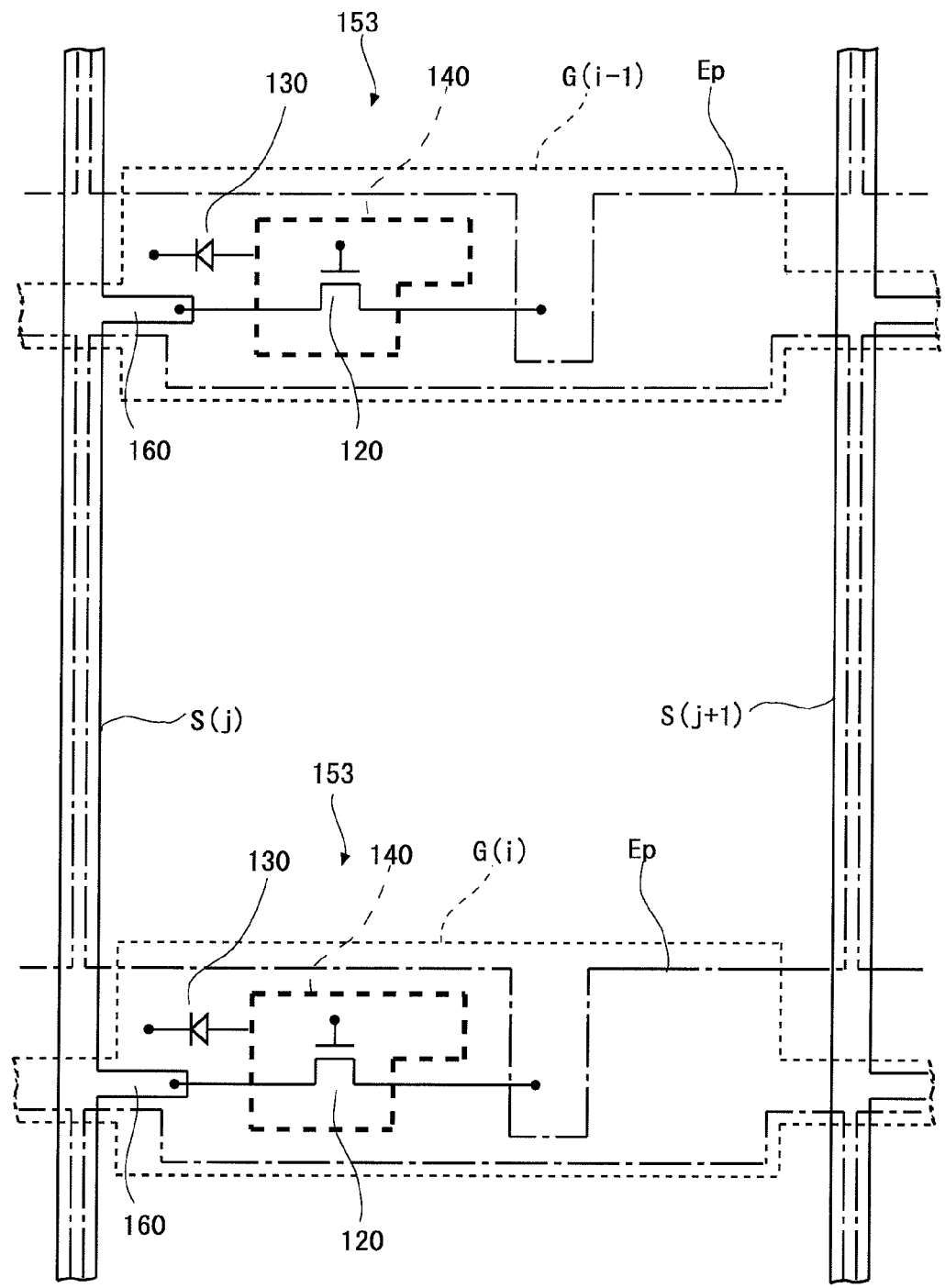
FIG. 15 is an enlarged plan view showing a configuration of a pixel formation portion in the liquid crystal display device of FIG. 14.

FIG. 15 is an enlarged plan view of the pixel formation portion 112 formed in the liquid crystal panel 102. As shown in FIG. 15, the video signal lines S(j) and S(j+1), the scanning signal lines G(i-1) and G(i), and the pixel electrode Ep are formed in the same positional relation as that in the liquid crystal panel 100 of the first embodiment.

In such a pixel formation portion 112, TFT control circuits 153 each constructed by the TFT 120, the diode 130, and the conductive plate 140 are formed on the scanning signal lines G(i-1) and G(i) near the intersections between the video signal line S(j) and the scanning signal lines G(i-1) and G(i).

In the TFT control circuit 153, the source electrode and the drain electrode of the TFT 120 and the anode of the diode 130 are connected in a manner similar to those in the TFT control circuit 150 of the first embodiment, and each of the scanning signal lines G(i-1) and G(i) formed below the TFT 120 via an insulating film also functions as the gate electrode of the TFT 120. However, in the TFT control circuit 153, different from the case of the TFT control circuit 150, the cathode of the diode 130 is connected to the scanning signal lines G(i-1) or G(i).

<3.3 Equivalent Circuit of TFT Control Circuit>

Figure 16:
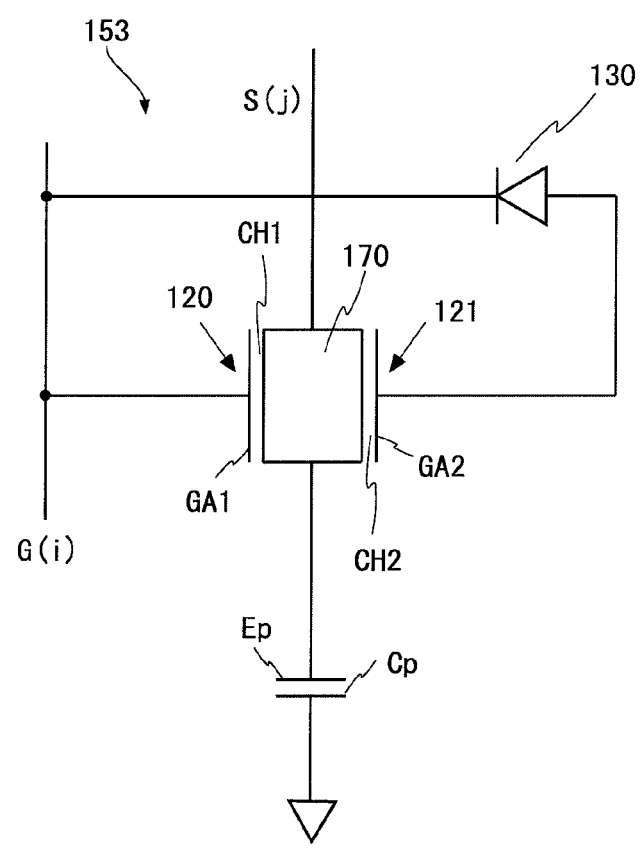
FIG. 16 is a circuit diagram showing an equivalent circuit of a TFT control circuit in the liquid crystal display device of FIG. 14.

FIG. 16 is a circuit diagram showing an equivalent circuit of the TFT control circuit 153. The electronic symbol expressing the TFT 120 in FIG. 16 is a symbol used for convenience in the specification as described in FIG. 3. As shown in FIG. 16, the gate electrode GA1 expresses the gate electrode of the TFT 120 using the scanning signal line G(i), and the gate electrode GA2 expresses the conductive plate 140 opposed to the channel region CH2 via the interlayer insulating film 192. That is, FIG. 16 shows that the TFT 120 having the gate electrode GA1 and the TFT 121 having the gate electrode GA2 are formed on both surfaces of the intrinsic silicon layer 170.

As described above, the cathode of the diode 130 is connected to the scanning signal line G(i), and the anode is connected to the gate electrode GA2 as the conductive plate 140. In the embodiment, the n-channel type TFT refers to a TFT in which when a positive voltage is applied to the gate electrode, an n-type channel layer is formed on the surface of the intrinsic silicon layer.

In the case where the potential applied to the scanning signal line G(i) is lower than that of the conductive plate 140, the voltage applied to the diode 130 becomes a forward voltage. Consequently, a current flows from the conductive plate 140 to the scanning signal line G(i) until the potential of the conductive plate 140 becomes equal to that of the scanning signal line G(i), and the potential of the conductive plate 140 becomes equal to that of the scanning signal line G(i).

On the other hand, in the case where the potential applied to the scanning signal line G(i) is higher than that of the conductive plate 140, the voltage applied to the diode 130 becomes an reverse voltage, so that no current flows. When the potential of the conductive plate 140 is higher than that of the scanning signal line G(i) as described above, the potential of the conductive plate 140 decreases until it becomes equal to that of the scanning signal line G(i). When the potential of the conductive plate 140 is lower than that of the scanning signal line G(i), the potential of the conductive plate 140 is held as it is.

As a result, the potential of the conductive plate 140 is clamped to the lowest potential among the potentials of the scanning signal line G(i). Consequently, when a current is passed to the liquid crystal display device for long periods of time, formation of an inversion layer in the channel region CH2 by charges accumulated in the interlayer insulating film is suppressed. As described above, the diode 130 clamps the potential of the conductive plate 140 to the lowest value among the potentials applied to the scanning signal line G(i) and, when the TFT 120 is in the off state, passage of leak current from the drain electrode to the source electrode via the channel region CH2 is suppressed.

For example, in the case where the potential applied to the scanning signal line G(i) changes in the range of −15 V to 25 V, the diode 130 clamps the potential of the conductive plate 140 finally to −15 V by application of the forward voltage or the reverse voltage depending on the magnitude relation between the potential of the scanning signal line G(i) and the potential of the conductive plate 140.

<3.4 Arrangement of Wiring Layers forming TFT Control Circuit>

Figure 17:
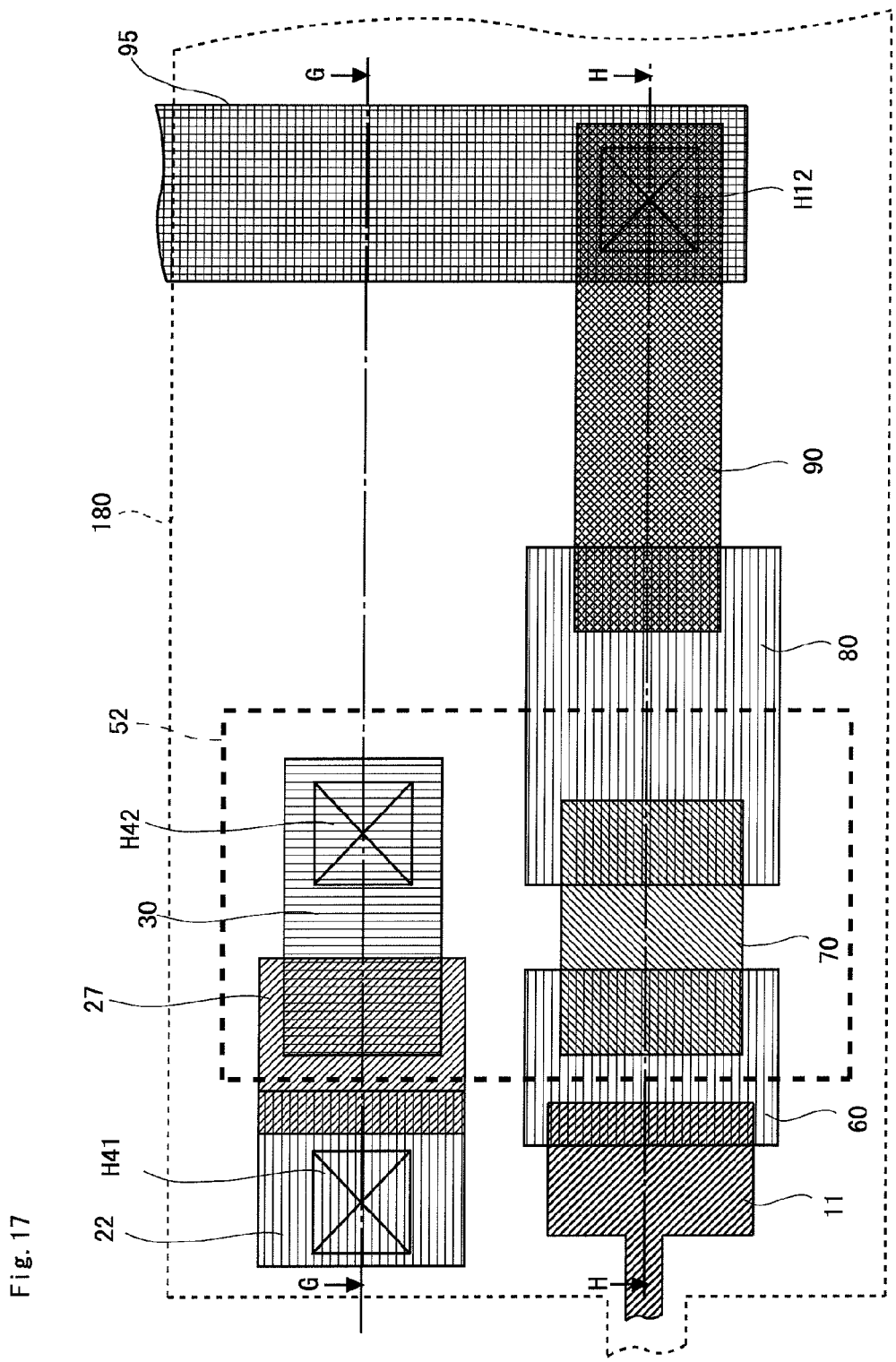
FIG. 17 is a plan view showing arrangement of wiring layers forming the TFT control circuit in the liquid crystal display device of FIG. 14.
Figure 18:
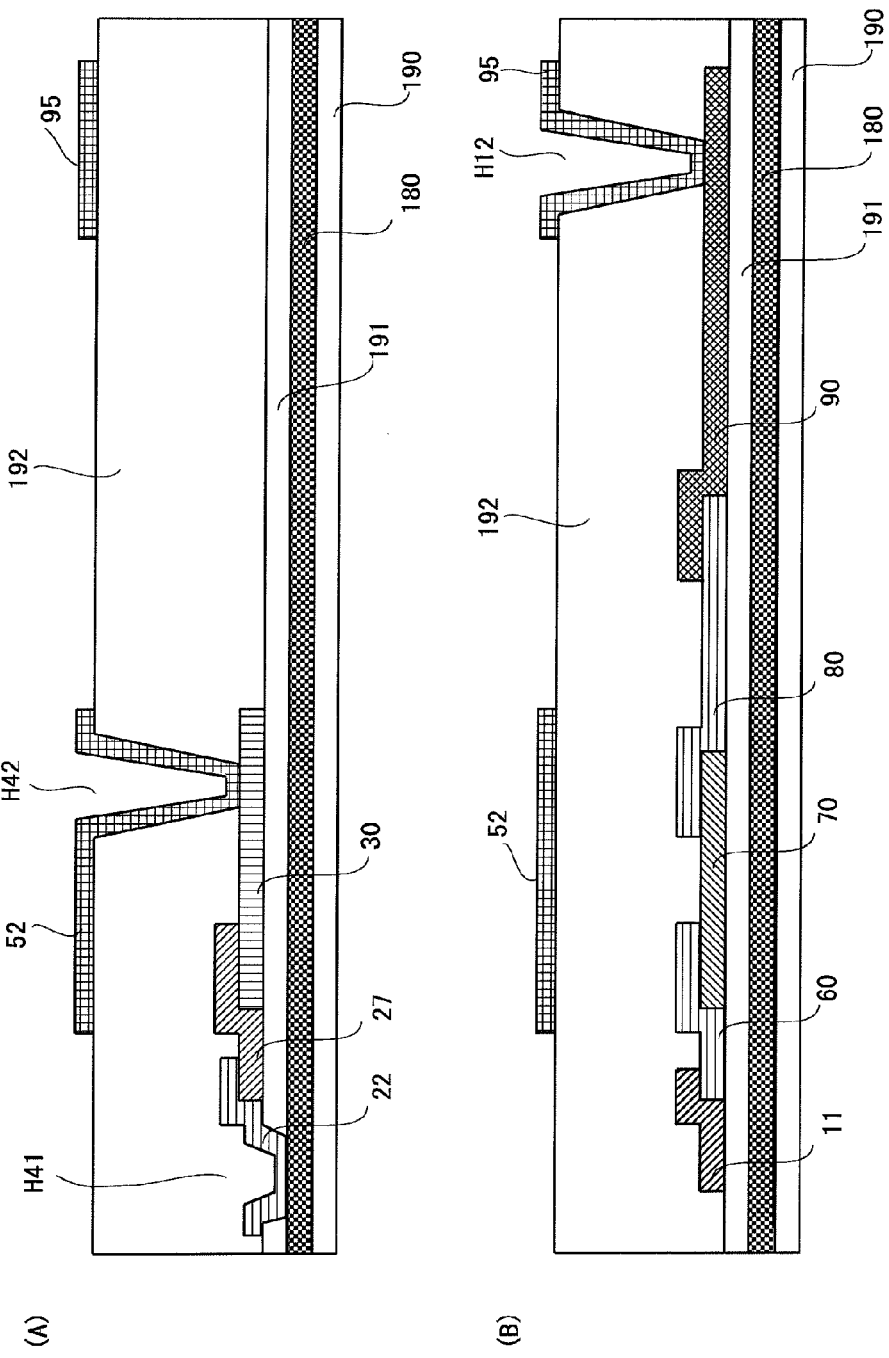
FIG. 18(A) is a cross-sectional view taken along line G-G of FIG. 17.
FIG. 18(B) is a cross-sectional view taken along line H-H of FIG. 17.

FIG. 17 is a plan view showing arrangement of wiring layers forming the TFT control circuit 153. FIG. 18(A) is a cross-sectional view taken along line G-G of FIG. 17, and FIG. 18(B) is a cross-sectional view taken along line H-H of FIG. 17.

Referring to FIGS. 17, 18(A), and 18(B), the arrangement of the wiring layers constructing the TFT 120 and the diode 130 included in the TFT control circuit 153 will be described. At the time of forming wiring layers of the TFT control circuit 153, first, a wiring layer constructing the TFT 120 is formed so that the characteristic of the TFT 120 does not change and, next, a wiring layer constructing the diode 130 is formed.

On the insulating transparent substrate 190 as the substrate of the liquid crystal panel 102, the wiring layer 180 also functioning as the gate electrode of the TFT 120 is formed. On the insulating film 191 formed on the surface of the wiring layer 180 and also functioning as the gate insulating film of the TFT 120, the channel layer 70 is formed. To the top face of one end of the channel layer 70, the under face of one end of the n$^+$silicon layer 60 is connected. The under face of a partially overlapped source input wiring layer 11 is connected to the top face of the other end of the n$^+$silicon layer 60. The under face of one end of the n$^+$silicon layer 80 is connected to the top face of the other end of the channel layer 70. The under face of the drain output wiring layer 90 as a drain output unit is connected to the top face of the other end of the n$^+$silicon layer 80. The other end of a drain output wiring layer 90 is connected to the metal layer 95 serving as the pixel electrode Ep formed on the top face of the interlayer insulating film 192 via the through hole H12 opened in the interlayer insulating film 192.

In such a manner, the n-channel type TFT 120 is formed in which the region where the n$^+$ silicon layer 60 and the channel layer 70 overlap is used as the source electrode, the region where the n$^+$ silicon layer 80 and the channel layer 70 overlap is used as the drain electrode, and the region in the channel layer 70 which is not overlapped with the n+silicon layers 60 and 80 is used as the channel region. The source electrode of the TFT 120 is connected to the video signal line via the source input wiring layer 11, and the drain electrode is connected to the metal layer 95 via the drain output wiring layer 90.

Next, the p+ silicon layer 30 is formed on the insulating film 191. The under face of one end of an n− silicon layer 27 is connected to the top face of one end of the p+silicon layer 30. One end of an n+ silicon layer 22 is connected to the top face of the other end of the n− silicon layer 27. The other end of the n+ silicon layer 22 is connected to the wiring layer 180 as a scanning signal line via a through hole H41 opened in the insulating film 191. The other end of the p+ silicon layer 30 is connected to a metal layer 52 as the conductive plate 140 formed on the top face of the interlayer insulating film 192 via a through hole H42 opened in the interlayer insulating film 192.

In such a manner, a pn junction diode in which the n+ silicon layer 22 and the n− silicon layer 27 function as the cathode, and the p+ silicon layer 30 functions as the anode is formed. The metal layer 52 is formed so as to function as the conductive plate 140 and cover the TFT 120. Although the p+ silicon layer 30 and the n+ silicon layer 22 can be directly connected to each other like in the case of the first embodiment, in this case, when a voltage in the reverse direction is applied to the pn junction diode, breakdown easily occurs in the diode 130 with a low voltage.

In the embodiment, like in the case of the first embodiment, each of the video signal line including the source input wiring layer 11 and the scanning signal line is formed by a single-layer film made of ITO, IZO, molybdenum, aluminum, or the like or a stack film obtained by properly combining them. Each of the n− silicon layer 27, the n+ silicon layers 22, 60, and 80, the p+ silicon layer 30, and the channel layer 70 is formed of amorphous silicon, and the interlayer insulating film 192 is formed by an organic insulating film made of polyimide or the like. The metal layer 52 serving as the conductive plate 140 and the drain output wiring layer 90 are made of ITO, IZO, molybdenum, aluminum, or the like, and the metal layer 95 serving as the pixel electrode Ep is made of ITO, IZO, or the like.

The video signal line including the source input wiring layer 11 and the scanning signal line may be also formed of amorphous silicon. The video signal line including the source input wiring layer 11, the scanning signal line, the n− silicon layer 27, the n+ silicon layers 22, 60, and 80, the p+ silicon layer 30, and the channel layer 70 may be formed of polycrystalline silicon or CG silicon. As the interlayer insulating film 192, a silicon nitride film formed by plasma CVD or the like may be used.

<3.5 Effects>

As described above, the conductive plate 140 is formed on the surface of the interlayer insulating film 192 so as to cover the TFT 120. The anode of the diode 130 is connected to the conductive plate 140, and the cathode is connected to the scanning signal line G(i). In the case where the potential applied to the scanning signal line G(i) is lower than that of the conductive plate 140, the forward voltage is applied to the diode 130. Consequently, a current flows from the conductive plate 140 to the scanning signal line G(i), and the potential of the conductive plate 140 becomes equal to that of the scanning signal line G(i). On the other hand, in the case where the potential of the scanning signal line G(i) is higher than that of the conductive plate 140, the reverse voltage is applied to the diode 130, so that no current flows. Consequently, the potential held on the conductive plate 140 is held as it is. In such a manner, the diode 130 clamps the potential of the conductive plate 140 to the lowest potential among the potentials applied to the scanning signal line G(i), and suppresses flow of leak current from the drain electrode to the source electrode when the TFT 120 is in the off state. Therefore, the liquid crystal display device can suppress a change in the off characteristic of the TFT 120 and display a high-quality video image even when the current passage time becomes long.

Since the area of the pixel electrode Ep does not change even when the diode 130 is formed on the scanning signal line G(i) in the pixel formation portion 112, without decreasing the aperture ratio of the liquid crystal panel 102, a change in the off characteristic of the TFT 120 can be suppressed.

<4. Fourth Embodiment>

Since a block diagram showing a configuration of an active matrix-type liquid crystal display device according to a fourth embodiment of the present invention, an enlarged plan view showing a configuration of a pixel formation portion included in the liquid crystal display device, and a circuit diagram showing an equivalent circuit of a TFT control circuit included in the pixel formation portion are similar to the block diagram showing the configuration of the active matrix-type liquid crystal display device according to the first embodiment shown in FIG. 1, the enlarged plan view showing the configuration of the pixel formation portion shown in FIG. 2, and the circuit diagram showing an equivalent circuit of the TFT control circuit 150 shown in FIG. 3, respectively, the diagrams and their description will not be given.

<4.1 Schottky Barrier Diode>

In a TFT control circuit 154 of the fourth embodiment, different from the TFT control circuit 150 shown in FIG. 2, a Schottky barrier diode is used as the diode 130. The Schottky barrier diode is a diode using a potential barrier called a Schottky barrier generated by junction of a metal layer and a semiconductor layer. The Schottky barrier is formed in the case where a work function $\phi m$ of the metal layer and a work function $\phi s$ of the semiconductor layer satisfy the relation of the following equation (1).

$$\phi m > \phi s \qquad (1)$$

FIG. 19(A) is a band diagram when a voltage in the forward direction is applied to a Schottky barrier, and FIG. 19(B) is a band diagram when a voltage in the reverse direction is applied to the Schottky barrier. When a positive voltage is applied to the metal layer and a negative voltage (forward voltage) is applied to the intrinsic silicon layer as shown in FIG. 19(A), Fermi level q$\phi$s of the intrinsic silicon layer becomes higher than Fermi level q$\phi$m of the metal layer. Consequently, height (qb-|V|) of the barrier seen from electrons in a conduction band of the intrinsic silicon layer becomes low, and electrons easily move from the intrinsic silicon layer to the metal layer. Since the height qB of the barrier seen from the electrons of the metal layer is unchanged at this time, the electrons of the metal layer cannot move to the intrinsic silicon layer. Note that q denotes a charge quantity of electrons, b denotes diffusion potential, V denotes an application voltage, and B indicates ($\phi$m-$\phi$s).

On the other hand, when a negative voltage is applied to the metal layer and a positive voltage (reverse voltage) is applied to the intrinsic silicon layer as shown in FIG. 19(B), the Fermi level q$\phi$s of the intrinsic silicon layer becomes lower than Fermi level q$\phi$m in of the metal layer. Consequently, height (qb+|V|) of the barrier seen from electrons in the conduction band of the intrinsic silicon layer becomes high, and electrons cannot move from the intrinsic silicon layer to the metal layer. Since the height qB of the barrier seen from the electrons of the metal layer is unchanged at this time, the electrons of the metal layer cannot move to the intrinsic silicon layer.

As described above, when the forward voltage is applied to the Schottky barrier diode, a current flows from the metal layer to the intrinsic silicon layer. When the reverse voltage is applied, no current flows. Consequently, by connecting the anode of the Schottky barrier diode to the conductive plate 140 and connecting the cathode to the video signal line S(j), the Schottky barrier diode functions like the pn junction diode in the first embodiment.

Since the work function $\phi s$ of intrinsic silicon is 4.5 eV, a metal satisfying equation (1), by which a Schottky barrier is formed with the intrinsic silicon is, for example, ITO ($\phi m$=4.7 eV), IZO ($\phi m$=5.4 eV), or the like. Consequently, by using intrinsic silicon as the cathode and using any of the metals as the anode, the Schottky barrier diode can be formed.

<4.2 Arrangement of Wiring Layers Forming TFT Control Circuit>

Figure 20:
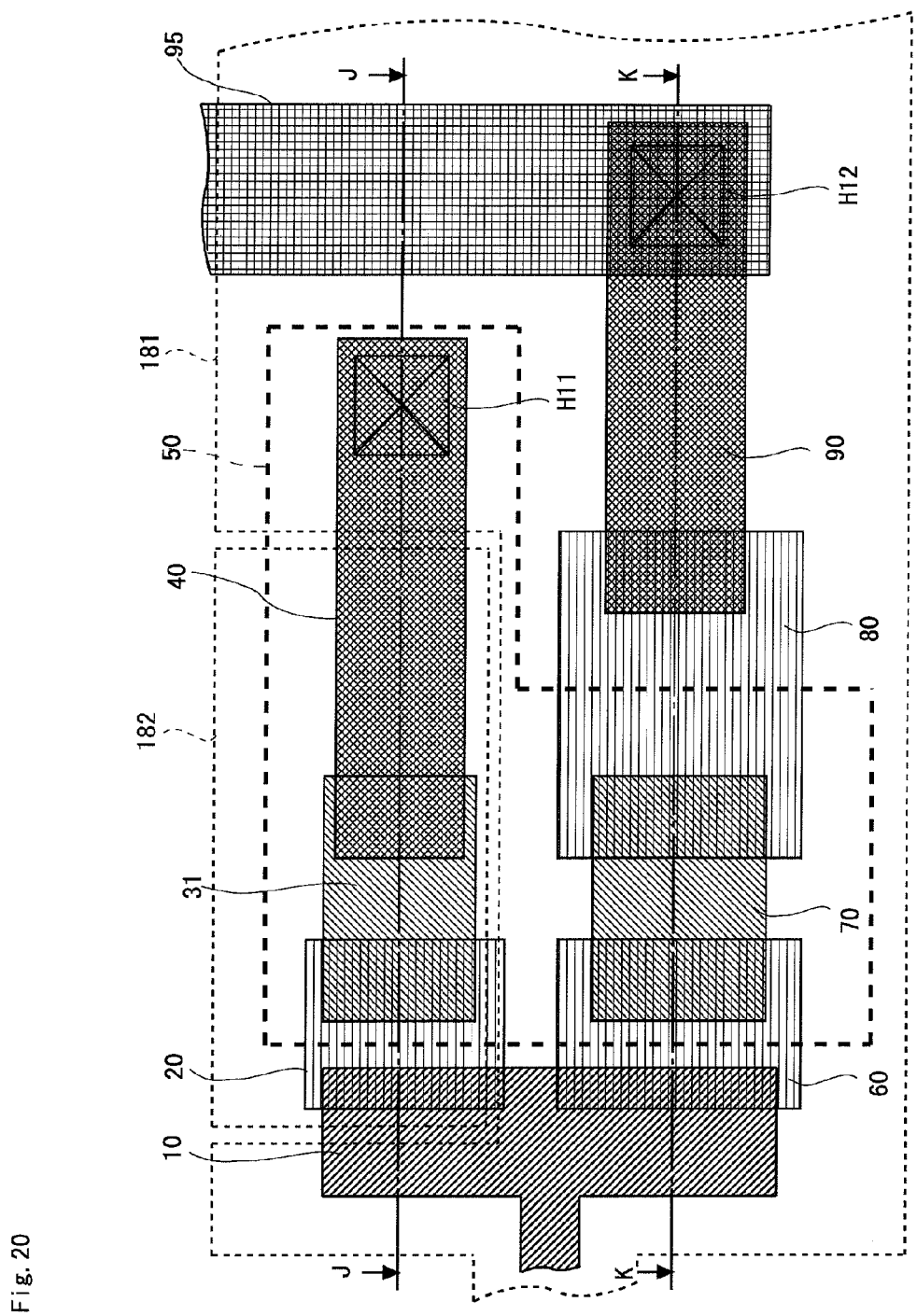
FIG. 20 is a plan view showing arrangement of wiring layers forming the TFT control circuit.
Figure 21:
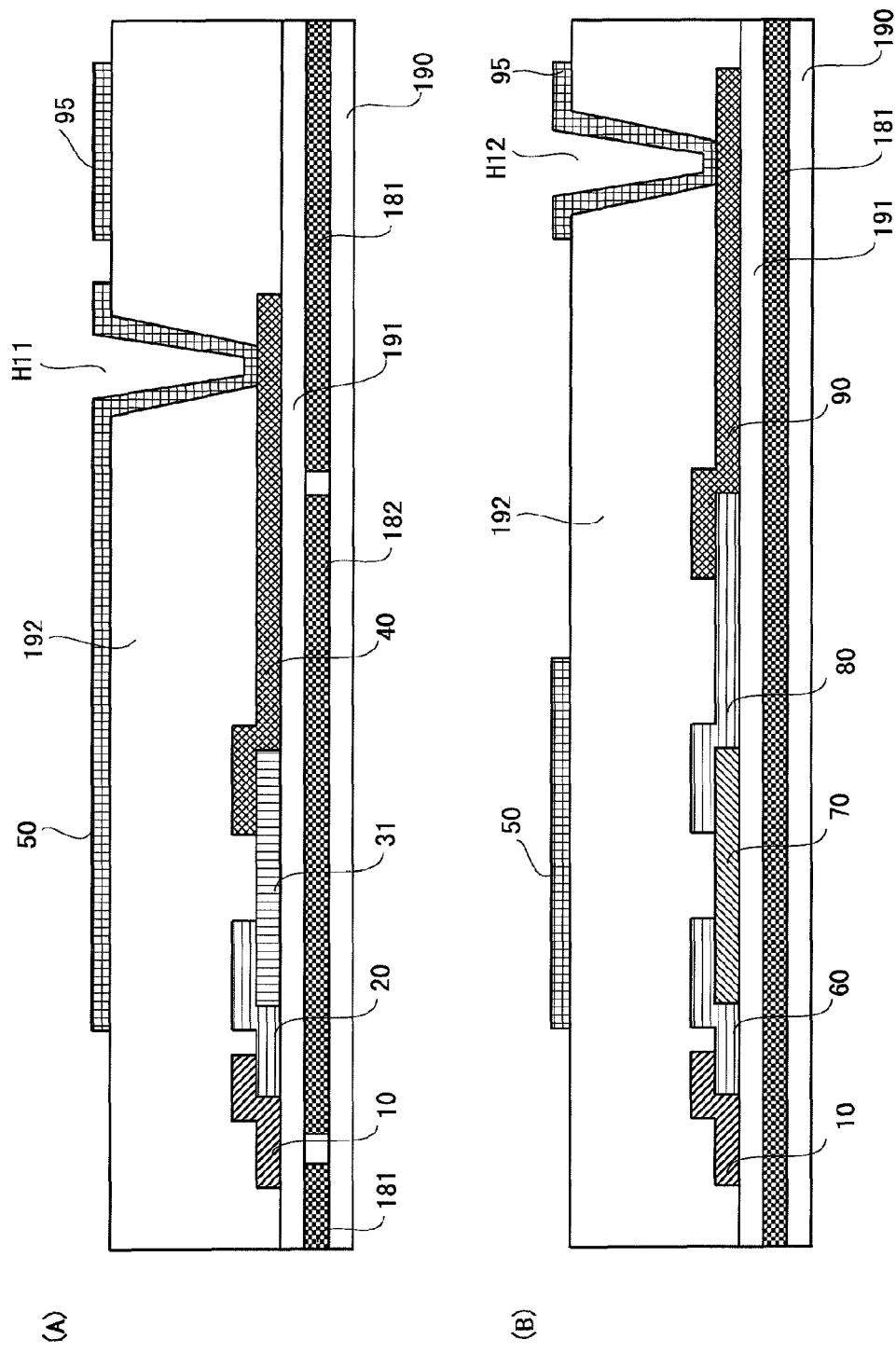
FIG. 21(A) is a cross-sectional view taken along line J-J of FIG. 20.
FIG. 21(B) is a cross-sectional view taken along line K-K of FIG. 20.

FIG. 20 is a plan view showing arrangement of wiring layers forming the TFT control circuit 154. FIG. 21(A) is a cross-sectional view taken along line J-J of FIG. 20, and FIG. 21(B) is a cross-sectional view taken along line K-K of FIG. 20.

Referring to FIGS. 20, 21(A), and 21(B), the arrangement of the wiring layers constructing each of elements included in the TFT control circuit 154 will be described. At the time of forming wiring layers of the TFT control circuit 154, first, a wiring layer constructing the TFT 120 is formed so that the characteristic of the TFT 120 does not change and, next, a wiring layer constructing the diode 130 is formed.

A wiring layer of the embodiment includes, different from the wiring layer 180 of the first embodiment, a wiring layer 181 and a wiring layer 182 electrically insulated from the wiring layer 181. On the insulating transparent substrate 190 as the substrate of the liquid crystal panel 100, the wiring layer 181 also functioning as the gate electrode of the TFT 120 and the wiring layer 182 electrically isolated from the wiring layer 181 are formed. The wiring layer 181 functions as the scanning signal line G(i) and also functions as the gate electrode of the TFT 120 in a manner similar to the wiring layer 180, and is formed in the horizontal direction in a manner similar to the wiring layer 180. However, in a region in which the wiring layer constructing the TFT 120 and the wiring layer constructing the diode 130 are formed in parallel, the wiring layer 181 is formed only below the wiring layer constructing the TFT 120, and the wiring layer 182 is formed below the wiring layer constructing the diode 130.

The reason why the wiring layer is divided into two wiring layers 181 and 182 will be described. To the wiring layer 181, a scanning signal which changes alternately between a positive voltage and a negative voltage is applied in order to turn on/off the TFT 120. When such a scanning signal is applied to the wiring layer 181, the characteristic of the diode 130 fluctuates and a problem occurs in that the potential of the conductive plate 140 cannot be decreased sufficiently. To address the problem, the wiring layer 182 to which no voltage is applied is formed in place of the wiring layer 181 only below the wiring layer constructing the diode 130, thereby preventing fluctuation in the characteristic of the diode 130. The wiring layer 180 in the first to third embodiments may be divided into two wiring layers 181 and 182 like in the case of the embodiment.

In the case where the fluctuations in the characteristic of the Shottky barrier diode caused by changes in the voltage of the scanning signal are in a permissible range, like the wiring layer 180 of the first embodiment, a single wiring layer may be employed in place of the wiring layers 181 and 182.

On the insulating film 191 formed on the surface of the wiring layer 181 and also functioning as the gate insulating film of the TFT 120, the channel layer 70 made of intrinsic silicon is formed. To the top face of one end of the channel layer 70, the under face of one end of the $n^+$ silicon layer 60 is connected. The under face of the $n^+$ silicon layer 80 is connected to the top face of the other end of the channel layer 70. The under face of one end of the drain output wiring layer 90 is connected to the top face of the other end of the $n^+$ silicon layer 80. The other end of the drain output wiring layer 90 is connected to the metal layer 95 serving as the pixel electrode Ep formed on the surface of the interlayer insulating film 192 via the through hole H12 opened in the interlayer insulating film 192.

In such a manner, the n-channel type TFT 120 is formed in which the region where the $n^+$ silicon layer 60 and the channel layer 70 overlap is used as the source electrode, the region where the $n^+$ silicon layer 80 and the channel layer 70 overlap is used as the drain electrode, and the region in the channel layer 70 which is not overlapped with the $n^+$ silicon layers 60 and 80 is used as the channel region. The source electrode of the TFT 120 is connected to the video signal line via the source input wiring layer 10 which will be described later, and the drain electrode is connected to the metal layer 95 via the drain output wiring layer 90.

Next, a silicon layer 31 made of intrinsic silicon is formed on the insulating film 191 formed on the surface of the wiring layer 182, and the $n^+$ silicon layer 20 is formed on the top face of one end of the silicon layer 31. Further, the under face of the source input wiring layer 10 which partially overlaps is connected to the top face of the $n^+$ silicon layer 20 and the above-described $n^+$ silicon layer 60. The under face of one end of the wiring layer 40 is connected to the top face of the other end of the silicon layer 31. The other end of the wiring layer 40 is connected to the metal layer 50 formed on the surface of the interlayer insulating film 192 via the through hole H11 opened in the interlayer insulating film 192.

In such a manner, a Schottky barrier diode in which the silicon layer 31 functions the cathode and the wiring layer 40 functions as the anode is formed. The metal layer 50 is formed so as to function as the conductive plate 140 and cover the TFT 120.

In the embodiment, for example, each of the video signal line including the source input wiring layer 10 and the scanning signal line is formed by a single-layer film made of ITO, IZO, molybdenum, aluminum, or the like or a stack film obtained by properly combining them. Each of the $n^+$ silicon layers 20, 60, and 80, the silicon layer 31, and the channel layer 70 is formed of amorphous silicon, and the interlayer insulating film 192 is formed by an organic insulating film made of polyimide or the like. The metal layer 50 serving as the conductive plate 140 and the wiring layers 40 and 90 are made of ITO, IZO, molybdenum, aluminum, or the like, and the metal layer 95 serving as the pixel electrode Ep is made of ITO, IZO, or the like.

The video signal line including the source input wiring layer 10 and the scanning signal line may be also formed of amorphous silicon. The video signal line including the source input wiring layer 10, the scanning signal line, the $n^+$ silicon layers 20, 60, and 80, the silicon layer 31, and the channel layer 70 may be formed of polycrystalline silicon or CG silicon. As the interlayer insulating film 192, a silicon nitride film formed by plasma CVD or the like may be used.

<4.3 Effects>

As described above, by using the Schottky barrier diode of the embodiment as the diode 130 of the TFT control circuit 154, like in the case of using the pn junction diode of the first embodiment, even when current passage time of the liquid crystal display device becomes long, a change in the off characteristic of the TFT 120 is suppressed, and a high-quality video image can be displayed. Without decreasing the aperture ratio of the liquid crystal panel 100, a change in the off characteristic of the TFT 120 can be suppressed.

Since the switching operation of the Schottky barrier diode is fast, in the case of using the Schottky barrier diode, the potential of the conductive plate 140 can be promptly clamped to the lowest potential among potentials applied to the video signal line S(j). Consequently, as compared with the case of using the pn junction diode, a change in the off characteristic of the TFT 120 can be further suppressed.

There is a problem in that the Schottky barrier diode has a low breakdown voltage in the reverse direction. However, in the embodiment, the cathode 130 is made of intrinsic silicon, so that the impurity concentration of the cathode 130 can be made low. In this case, even when the reverse voltage is applied to the junction of the Schottky barrier diode, the electric field intensity in the junction is lessened, so that the reverse breakdown voltage of the Schottky barrier diode can be made higher.

<4. Modifications Common to First to Fourth Embodiments>

In the first to fourth embodiments, it has been described that the scanning signal line also has the function of the gate electrode of the TFT 120. The gate electrode may be branched from the scanning signal line and extended below the channel region of the TFT 120.

In the first to fourth embodiments, the conductive plate 140 is formed on the surface of the interlayer insulating film 192 or the orientation film. In any of the embodiments, the conductive plate 140 may be formed inside the interlayer insulating film 192. In this case, the distance between the conductive plate 140 and the channel region CH2 in the intrinsic silicon layer 170 becomes short, so that formation of an inversion layer in the channel region CH2 is further suppressed, and a change in the off characteristic of the TFT 120 can be suppressed.

Although the conductive plate 140 has a flat plane shape in the first to fourth embodiments, by making a part facing the channel region CH2, in the conductive plate 140 recessed, the channel region CH2 and the conductive plate 140 may be positioned closer to each other while sandwiching the interlayer insulating film 192. In this case as well, the distance between the conductive plate 140 and the channel region CH2 becomes short, so that formation of an inversion layer in the channel region CH2 is suppressed, and a change in the off characteristic of the TFT 120 can be suppressed.

A change in the off characteristic of the TFT 120 can be suppressed not only in the case where alkali-free glass is used as the insulating transparent substrate 190 serving as the substrate of the liquid crystal panel but also in the case of using alkali glass.

Although the TFT 120 is of the n channel type in the first to fourth embodiments, it may be of the p channel type. In the case of using a p-channel-type TFT, the n$^+$ silicon layers 20, 60, and 80 have to be replaced with p$^+$ silicon layers, and the n silicon layers 25, 26, and 27 have to be replaced with p$^-$ silicon layers.

It has been described that the pixel electrode Ep of the pixel formation portion is formed so that its peripheral part overlaps a part of the video signal lines S(j), S(j+1), and the scanning signal lines G(i-1) and G(i). However, like a multi pixel as an example, also by forming the pixel electrode Ep so that its peripheral part does not overlap a part of the video signal lines S(j) and S(j+1) and the scanning signal lines G(i-1) and G(i), a change in the off characteristic of the TFT 120 can be suppressed.

Although the liquid crystal display device has been described in the first to fourth embodiments, also in an active matrix-type display device other than liquid crystal display device, by providing the TFT control circuits 150 to 153 in each pixel formation portion, a change in the off characteristic of the TFT can be suppressed.

INDUSTRIAL APPLICABILITY

In an active matrix substrate of the present invention, even when the current passage time becomes long, a change in the off characteristic of the TFT can be suppressed. Consequently, the active matrix substrate can be used for a display in a television, a personal computer, or the like.

DESCRIPTION OF THE REFERENCE NUMERALS

100 to 102: LIQUID CRYSTAL PANEL
110 to 112: PIXEL FORMATION PORTION
120: TFT (THIN FILM TRANSISTOR)
130: DIODE
140: CONDUCTIVE PLATE
150 to 154: TFT CONTROL CIRCUIT

The invention claimed is:

1. An active matrix substrate comprising:
a plurality of video signal lines for transmitting a plurality of video signals;
a plurality of scanning signal lines intersecting the plurality of video signal lines; and
a plurality of pixel formation portions disposed in a matrix form at respective intersections of the plurality of video signal lines and the plurality of scanning signal lines, wherein
each of the pixel formation portions includes:
a thin film transistor having a source electrode connected to a video signal line passing through the corresponding intersection and entering a conductive state when a scanning signal line passing through the corresponding intersection is activated;
a pixel electrode connected to a drain electrode of the thin film transistor;
a conductive plate formed in a position on a side of an intrinsic semiconductor layer serving as a channel region of the thin film transistor opposite to a side of the intrinsic semiconductor layer on which the scanning signal line is formed, so as to cover at least the channel region; and
a diode in which an anode and a first cathode are joined, and the anode is connected to the conductive plate, and the first cathode is connected to any one of the video signal line, the pixel electrode, and the scanning signal line.

2. The active matrix substrate according to claim 1, wherein the diode is a pn junction diode.

3. The active matrix substrate according to claim 2, wherein the anode of the diode contains an impurity of a first conductivity type, the first cathode contains an impurity of a second conductivity type, and
the diode further includes a second cathode containing an impurity of the second conductivity type having concentration lower than that of the first cathode, between the anode and the first cathode.

4. The active matrix substrate according to claim 1, wherein the diode is a Schottky barrier diode.

5. The active matrix substrate according to claim 4, wherein the first cathode of the diode includes an intrinsic semiconductor layer, the anode of the diode includes a metal wiring layer having a work function larger than that of the intrinsic semiconductor layer, and the Schottky barrier diode is formed by making the metal wiring layer and the intrinsic semiconductor layer in contact with each other.

6. The active matrix substrate according to claim 4, wherein the scanning signal line includes a first scanning signal line for activating the thin film transistor and a second scanning signal line electrically insulated from the first scanning signal line, and the Schottky barrier diode is formed above the second scanning signal line.

7. A display device comprising an active matrix substrate according to claim 1.

* * * * *